(12) United States Patent
Barr et al.

(10) Patent No.: US 11,672,134 B2
(45) Date of Patent: Jun. 6, 2023

(54) PARA-PHENYLENES AS BUFFER AND COLOR TUNING LAYERS FOR SOLAR CELLS

(71) Applicant: Ubiquitous Energy, Inc., Redwood City, CA (US)

(72) Inventors: Miles C. Barr, Redwood City, CA (US); Richa Pandey, Sunnyvale, CA (US); John A. Love, Mountain View, CA (US); Matthew E. Sykes, Redwood City, CA (US)

(73) Assignee: UBIQUITOUS ENERGY, INC., Redwood City, CA (US)

( * ) Notice: Subject to any disclaimer, the term of this patent is extended or adjusted under 35 U.S.C. 154(b) by 83 days.

(21) Appl. No.: 16/994,376

(22) Filed: Aug. 14, 2020

(65) Prior Publication Data

US 2021/0050539 A1 Feb. 18, 2021

Related U.S. Application Data

(60) Provisional application No. 62/887,983, filed on Aug. 16, 2019.

(51) Int. Cl.
*H01B 1/12* (2006.01)
*H01L 51/42* (2006.01)
*H01L 51/44* (2006.01)
*H01L 51/00* (2006.01)

(52) U.S. Cl.
CPC ...... *H01L 51/4253* (2013.01); *H01L 51/0001* (2013.01); *H01L 51/448* (2013.01); *H01L 2251/30* (2013.01)

(58) Field of Classification Search
CPC ........ H01L 2031/0344; H01L 51/0034; C08G 61/10
See application file for complete search history.

(56) References Cited

U.S. PATENT DOCUMENTS

| 5,780,149 A | 7/1998 | Mccurdy et al. |
| 9,660,207 B2 | 5/2017 | Ihn et al. |
| 2005/0110007 A1 | 5/2005 | Forrest et al. |

(Continued)

FOREIGN PATENT DOCUMENTS

| KR | 101098792 B1 | 12/2011 |
| WO | 2009070534 A1 | 6/2009 |

OTHER PUBLICATIONS

Dang, et al., "An Improved Performance of Copper Phthalocyanine OFETs with Channel and Source/Drain Contact Modifications", Journal of Semiconductors, vol. 36, No. 10, Oct. 2015, pp. 1-5.

(Continued)

*Primary Examiner* — Jae Lee
(74) *Attorney, Agent, or Firm* — Kilpatrick Townsend & Stockton LLP

(57) ABSTRACT

Photovoltaic devices having photoactive layers coupled to buffer layers are disclosed. Such devices may be transparent to visible light but absorb near-infrared light and/or ultraviolet light. The photovoltaic devices may include a p-phenylene layer that acts as a buffer layer. The photovoltaic devices may include one or more photoactive layers. The one or more photoactive layers may include a single planar heterojunction, a single bulk heterojunction (BHJ), or multiple stacked BHJs that have complementary absorption characteristics, among other possibilities.

20 Claims, 22 Drawing Sheets

(56) References Cited

U.S. PATENT DOCUMENTS

| | | | |
|---|---|---|---|
| 2010/0084011 A1 | 4/2010 | Forrest et al. | |
| 2010/0294351 A1 | 11/2010 | Holmes et al. | |
| 2012/0011784 A1 | 1/2012 | Shiao et al. | |
| 2012/0097229 A1 | 4/2012 | Aoki | |
| 2013/0074904 A1* | 3/2013 | Suzuki | H01L 27/302 |
| | | | 136/244 |
| 2013/0104968 A1 | 5/2013 | Pfeiffer et al. | |
| 2014/0000714 A1 | 1/2014 | Rand et al. | |
| 2017/0192257 A1 | 7/2017 | Branda et al. | |
| 2018/0019421 A1 | 1/2018 | Bulovic et al. | |
| 2018/0366654 A1 | 12/2018 | Barr et al. | |
| 2018/0366658 A1 | 12/2018 | Barr et al. | |
| 2018/0366667 A1 | 12/2018 | Barr et al. | |
| 2019/0088880 A1* | 3/2019 | Asaka | C08K 5/06 |
| 2020/0335727 A1* | 10/2020 | Makishima | B32B 7/02 |
| 2021/0057661 A1 | 2/2021 | Forrest et al. | |

OTHER PUBLICATIONS

PCT/US2020/046514, "International Search Report and Written Opinion", dated Oct. 22, 2020, 12 pages.

PCT/US2020/046515, "International Search Report and Written Opinion", dated Nov. 6, 2020, 10 pages.

PCT/US2020/046516, "International Search Report and Written Opinion", dated Nov. 6, 2020, 10 pages.

U.S. Appl. No. 16/994,363, "Final Office Action", dated Jan. 24, 2022, 11 pages.

Gusain, et al., "Polymer Solar Cells-Interfacial Processes Related to Performance Issues", Frontiers in Chemistry, vol. 7, Article 61, Feb. 2019, pp. 1-25.

U.S. Appl. No. 16/994,369, "Non-Final Office Action", Sep. 8, 2021, 18 pages.

Li, et al., "Flexible and Semitransparent Organic Solar Cells", Advanced Energy Materials, Available online at: https://doi.org/10.1002/aenm.201701791, Nov. 22, 2017.

U.S. Appl. No. 16/994,363, "Non-Final Office Action", dated Sep. 23, 2021, 8 pages.

Colberts, et al., "Bilayer-Ternary Polymer Solar Cells Fabricated Using Spontaneous Spreading on Water", Advanced Energy Materials, vol. 8, No. 32, Oct. 3, 2018, pp. 1-12.

Ghasemi, et al., "Panchromatic Sequentially Cast Ternary Polymer Solar Cells", Advanced Materials, vol. 29, No. 1, Jan. 25, 2017, pp. 1-8.

U.S. Appl. No. 16/994,369, "Final Office Action", dated Feb. 18, 2022, 17 pages.

Lassiter, et al., "Organic Photovoltaics Incorporating Electron Conducting Exciton Blocking Layers", Applied Physics Letters, vol. 98, Issue 24, Jun. 15, 2011, 3 pages.

PCT/US2020/046514, "International Preliminary Report on Patentability", dated Mar. 3, 2022, 11 pages.

PCT/US2020/046515, "International Preliminary Report on Patentability", dated Mar. 3, 2022, 9 pages.

PCT/US2020/046516, "International Preliminary Report on Patentability", dated Mar. 3, 2022, 9 pages.

Song, et al., "Visibly-Transparent Organic Solar Cells on Flexible Substrates with All-Graphene Electrodes", Advanced Energy Materials, vol. 6, Issue 20, 1600847, Oct. 26, 2016, 8 pages.

U.S. Appl. No. 16/994,363, "Final Office Action", dated Dec. 1, 2022, 8 pages.

U.S. Appl. No. 16/994,369, "Final Office Action", dated Dec. 1, 2022, 17 pages.

Huang, et al., "Highly Efficient Organic Solar Cells Consisting of Double Bulk Heterojunction Layers", Advanced Science News, May 2017, pp. 1-9.

Lee, et al., "Colored Dual-Functional Photovoltaic Cells", Journal of Optics, vol. 18, No. 6, 2016, 23 pages.

U.S. Appl. No. 16/994,363, "Non-Final Office Action", dated Jul. 13, 2022, 7 pages.

U.S. Appl. No. 16/994,369, "Non-Final Office Action", dated Jun. 13, 2022, 18 pages.

Che, "High Efficiency Single and Multijunction Organic Photovoltaics", A Dissertation Submitted In Partial Fulfilment of The Requirements for the Degree of Doctor of Philosophy, 2018, 172 pages.

* cited by examiner

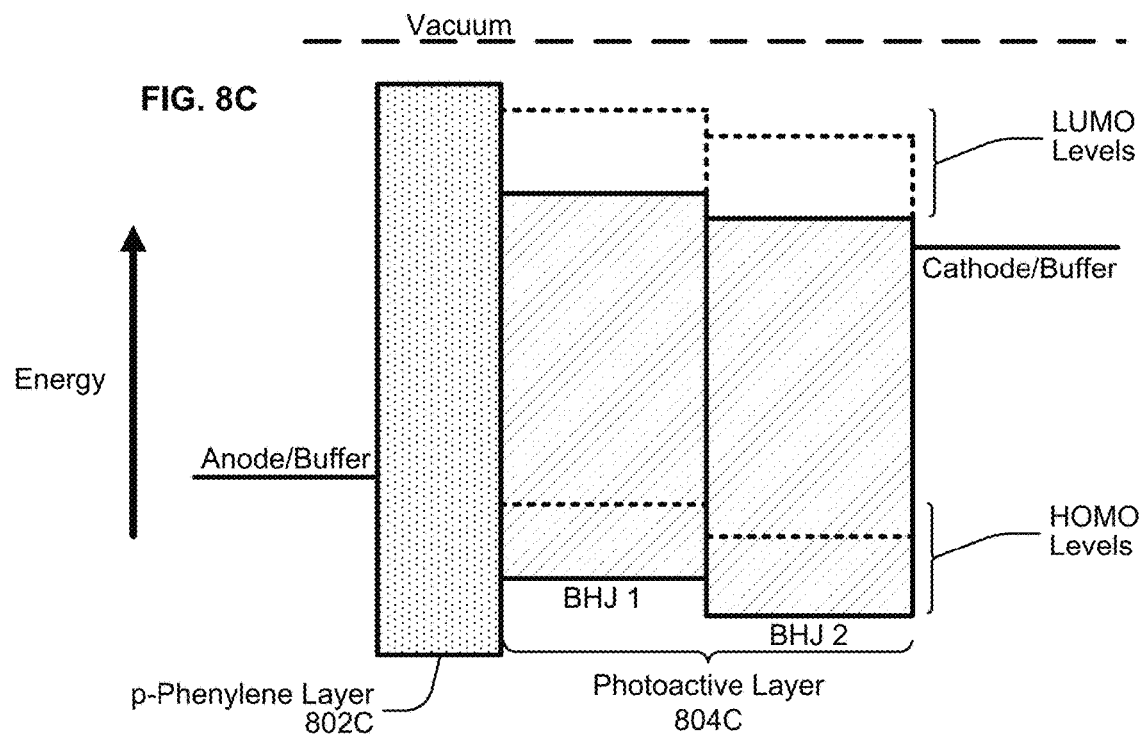
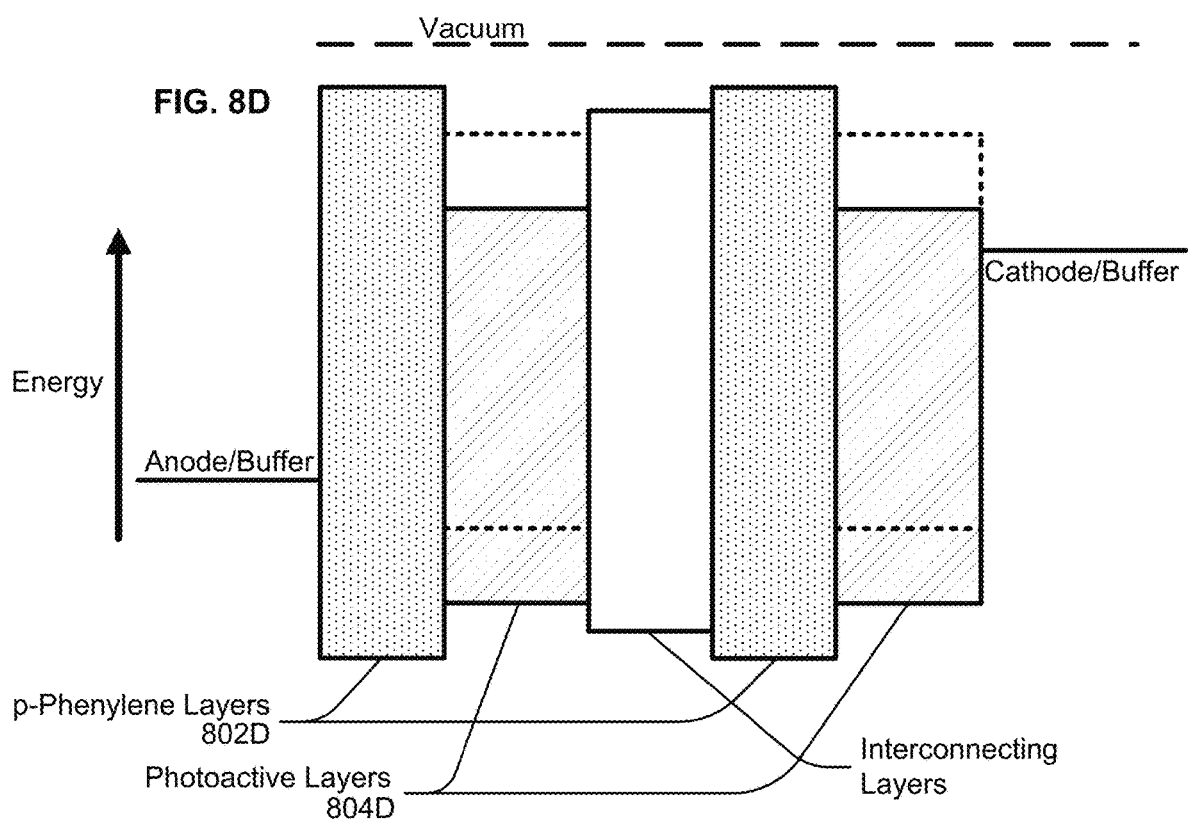

1100A

| HAT-CN (50 nm) |
| --- |
| Ag (8 nm) |
| TPBi:$C_{60}$ (5 nm) |
| $C_{60}$ (10 nm) |
| D-100:$C_{60}$ (60 nm) |
| p-Phenylene (x nm) |
| $MoO_3$ (8 nm) |
| ITO |
| Glass Substrate |

| HAT-CN (50 nm) |
| --- |
| Ag (8 nm) |
| TPBi:$C_{60}$ (5 nm) |
| $C_{70}$ (10 nm) |
| D-300:$C_{60}$ (60 nm) |
| p-Phenylene (x nm) |
| $MoO_3$ (8 nm) |
| ITO |
| Glass Substrate |

| HAT-CN (50 nm) |
| --- |
| Ag (8 nm) |
| TPBi:$C_{60}$ (5 nm) |
| $C_{70}$ (10 nm) |
| D-300:$C_{70}$ (30 nm) |
| D-310:$C_{70}$ (30 nm) |
| p-Phenylene (x nm) |
| $MoO_3$ (8 nm) |
| ITO |
| Glass Substrate |

| HAT-CN (50 nm) |
| --- |
| Ag (8 nm) |
| TPBi:$C_{60}$ (5 nm) |
| $C_{70}$ (10 nm) |
| D-300:$C_{70}$ (30 nm) |
| D-310:$C_{70}$ (30 nm) |
| p-Phenylene (x nm) |
| HAT-CN (5 nm) |
| ITO |
| Glass Substrate |

FIG. 11D

| D100:C$_{60}$ Devices (Glass-Side Reflection) | AVR (%) | Lab L* | Lab a* | Lab b* |
|---|---|---|---|---|
| Without p-Sexiphenyl Layer | 5.9 | 29.9 | 9.3 | 1.5 |
| With 10 nm p-Sexiphenyl Layer | 5.6 | 28.9 | 9.1 | -2.9 |

FIG. 13A

| D300:C$_{60}$ Devices (Glass-Side Reflection) | AVR (%) | Lab L* | Lab a* | Lab b* |
|---|---|---|---|---|
| Without p-Sexiphenyl Layer | 7.6 | 34.2 | -8.5 | 6.8 |
| With 30 nm p-Sexiphenyl Layer | 7.9 | 34.9 | -3.1 | 8.8 |

FIG. 13B

| D310:C$_{60}$+D300:C$_{60}$ (Glass-Side Reflection) | AVR (%) | Lab L* | Lab a* | Lab b* |
|---|---|---|---|---|
| Without p-Sexiphenyl Layer | 5.9 | 29.8 | 7.5 | -0.8 |
| With 24 nm p-Sexiphenyl Layer | 6.5 | 31.3 | -2.8 | -5.8 |

FIG. 13C

PARA-PHENYLENES AS BUFFER AND COLOR TUNING LAYERS FOR SOLAR CELLS

CROSS-REFERENCES TO RELATED APPLICATIONS

This application claims the benefit of priority to U.S. Provisional Patent Application No. 62/887,983, filed Aug. 16, 2019, entitled "PARA-PHENYLENES AS BUFFER AND COLOR TUNING LAYERS FOR SOLAR CELLS," the entire content of which is incorporated herein by reference for all purposes.

BACKGROUND OF THE INVENTION

Photovoltaic devices are commonly employed to convert light into electricity by using the photovoltaic effect, in which absorbed light causes the excitation of an electron or other charge carrier to a higher-energy state. The separation of charge carriers of opposite types leads to a voltage that can be utilized by an external circuit. Photovoltaic devices, such as photovoltaic solar cells, can be packaged together to constitute a photovoltaic array of a larger photovoltaic system, such as a solar panel. The use of photovoltaic systems to generate electricity is an important form of renewable energy that continues to become a mainstream electricity source worldwide.

The surface area necessary to take advantage of solar energy remains an obstacle to offsetting a significant portion of non-renewable energy consumption. For this reason, low-cost, transparent, organic photovoltaic (OPV) devices that can be integrated onto window panes in homes, skyscrapers, and automobiles are desirable. For example, window glass utilized in automobiles and architecture are typically 70-80% and 40-80% transmissive, respectively, to the visible spectrum, e.g., light with wavelengths from about 450 to 650 nm. The low mechanical flexibility, high module cost and, more importantly, the band-like absorption of inorganic semiconductors limit their potential utility to transparent solar cells. Despite the progress made, there is a need in the art for improved systems, methods, and device structures in the field of transparent solar technology.

SUMMARY OF THE INVENTION

Transparent organic photovoltaic (OPV) devices that can be integrated onto windows panes are desirable for providing large surface areas to take advantage of solar energy. In contrast to inorganic semiconductors, the optical characteristics of organic and molecular semiconductors result in absorption spectra that are highly structured with absorption minima and maxima that are uniquely distinct from the band absorption of their inorganic counterparts. However, while a variety of organic and molecular semiconductors exist, many exhibit strong absorption in the visible spectrum and thus are not optimal for use in window glass-based photovoltaics.

This application relates generally to the field of optically active materials and devices, and, more particularly, to visibly transparent and visibly opaque photovoltaic devices and materials for visibly transparent and visibly opaque photovoltaic devices.

A summary of the present invention is provided in reference to various examples given below. As used below, any reference to a series of examples is to be understood as a reference to each of those examples disjunctively (e.g., "Examples 1-4" is to be understood as "Examples 1, 2, 3, or 4").

Example 1 is an organic photovoltaic device comprising: a substrate; a first electrode coupled to the substrate; a buffer layer coupled to the first electrode, wherein the buffer layer comprises a p-phenylene layer having a p-phenylene material; a second electrode disposed above the first electrode; and one or more photoactive active layers disposed between the buffer layer and the second electrode, the one or more photoactive layers having at least one electron donor material and at least one electron acceptor material.

Example 2 is the organic photovoltaic device of example(s) 1, wherein the p-phenylene material comprises a p-septiphenyl material, a p-sexiphenyl material, a p-quaterphenyl material, or a p-quinquiphenyl material.

Example 3 is the organic photovoltaic device of example(s) 1, wherein the p-phenylene material has a formula of:

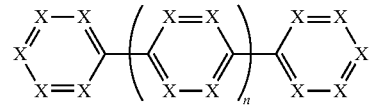

wherein each X is independently C—R or N, wherein n is 1, 2, 3, 4, or 5, and wherein each R is independently H, F, Cl, Br, CH3, OCH3, Si(CH3)3, NH2, OH, SH, CN, or CF3.

Example 4 is the organic photovoltaic device of example(s) 1, wherein the one or more photoactive layers include a single heterojunction.

Example 5 is the organic photovoltaic device of example(s) 4, wherein the single heterojunction is a planar heterojunction.

Example 6 is the organic photovoltaic device of example(s) 4, wherein the single heterojunction is a bulk heterojunction (BHJ).

Example 7 is the organic photovoltaic device of example(s) 1, wherein the one or more photoactive layers include a first bulk heterojunction (BHJ) active layer comprising a first blend of a first electron donor material and a first electron acceptor material and a second BHJ active layer comprising a second blend of a second electron donor material and a second electron acceptor material, wherein the second BHJ active layer is in contact with the first BHJ active layer.

Example 8 is the organic photovoltaic device of example(s) 1, further comprising: a first subcell including one or more first photoactive layers; a second subcell disposed between the first subcell and the second electrode, the second subcell including one or more second photoactive layers; and a charge recombination zone disposed between the first subcell and the second subcell.

Example 9 is the organic photovoltaic device of example(s) 8, wherein the buffer layer is disposed between the first electrode and the first subcell.

Example 10 is the organic photovoltaic device of example(s) 8, wherein the buffer layer is disposed between the charge recombination zone and the second subcell.

Example 11 is the organic photovoltaic device of example(s) 8, wherein the buffer layer is disposed between the first electrode and the first subcell, and wherein the organic photovoltaic device further comprises: a second buffer layer disposed between the charge recombination zone and the second subcell, wherein the second buffer layer comprises a second p-phenylene layer having a second p-phenylene material.

Example 12 is the organic photovoltaic device of example(s) 11, wherein the second p-phenylene material is different than the first p-phenylene material.

Example 13 is the organic photovoltaic device of example(s) 11, wherein the second p-phenylene material is the same as the first p-phenylene material.

Example 14 is the organic photovoltaic device of example(s) 1, wherein the one or more photoactive active layers were deposited via thermally evaporation.

Example 15 is the organic photovoltaic device of example(s) 1, wherein the one or more photoactive active layers were deposited via solution processing.

Example 16 is the organic photovoltaic device of example(s) 1, wherein the organic photovoltaic device is transparent.

Example 17 is the organic photovoltaic device of example(s) 16, wherein the organic photovoltaic device has a glass-reflected a* between −10 and 10.

Example 18 is the organic photovoltaic device of example(s) 16, wherein the organic photovoltaic device has a glass-reflected b* between −10 and 10.

Example 19 is the organic photovoltaic device of example(s) 1, wherein the organic photovoltaic device is opaque.

Example 20 is the organic photovoltaic device of example(s) 1, further comprising: a hole injection layer disposed between the first electrode and the p-phenylene layer, wherein the hole injection layer is one of MoOx, NiOx, CuOx, VOx, WOx, CoOx, CrOx, Li:NiOx, Mg:NiOx, Cs:NiOx, Cu:CrOx, CryCuzOx, LiMgLiO, CuSCN, CuI, BiI3, Graphene, Graphene Oxide, or MoS2, corresponding to both stoichiometric and non-stoichiometric compositions.

Example 21 is the organic photovoltaic device of example(s) 1, wherein the p-phenylene layer has a thickness between 2 and 50 nm.

Example 22 is the organic photovoltaic device of example(s) 1, wherein the organic photovoltaic device has an average visible transmission (AVT) between 40%-70%.

Example 23 is a method of forming an organic photovoltaic device, the method comprising: providing a substrate; forming a first electrode coupled to the substrate; forming a buffer layer coupled to the first electrode, wherein the buffer layer comprises a p-phenylene layer having a p-phenylene material; forming a second electrode above the first electrode; and forming one or more photoactive active layers between the buffer layer and the second electrode, the one or more photoactive layers having at least one electron donor material and at least one electron acceptor material.

Example 24 is the method of example(s) 23, wherein the one or more photoactive layers include a single heterojunction.

Example 25 is the method of example(s) 23, wherein the one or more photoactive layers include a first bulk heterojunction (BHJ) active layer comprising a first blend of a first electron donor material and a first electron acceptor material and a second BHJ active layer comprising a second blend of a second electron donor material and a second electron acceptor material.

Example 26 is the method of example(s) 23, wherein forming the one or more photoactive active layers includes depositing the one or more photoactive layers via thermally evaporation.

Example 27 is the method of example(s) 23, wherein forming the one or more photoactive active layers includes depositing the one or more photoactive layers via solution processing.

Example 28 is the organic photovoltaic device of example(s) 1, wherein the one or more photoactive layers include a first bulk heterojunction (BHJ) active layer comprising a first blend of a first electron donor material and a first electron acceptor material.

Example 29 is the organic photovoltaic device of example(s) 28, wherein the one or more photoactive layers further include a second BHJ active layer comprising a second blend of a second electron donor material and a second electron acceptor material, wherein a peak absorption wavelength of the first BHJ active layer is at least partially complementary to a peak absorption wavelength of the second BHJ active layer.

Example 30 is the organic photovoltaic device of example(s) 29, wherein the first donor material is different than the second donor material, and wherein the first acceptor material is different than the second acceptor material.

Example 31 is the organic photovoltaic device of example(s) 29, wherein the first donor material is different than the second donor material, and wherein the first acceptor material is the same as the second acceptor material.

Example 32 is the organic photovoltaic device of example(s) 29, wherein the first donor material is the same as the second donor material, and wherein the first acceptor material is different than the second acceptor material.

Example 33 is the organic photovoltaic device of example(s) 29, wherein the first donor material is the same as the second donor material, and wherein the first acceptor material is the same as the second acceptor material.

Example 34 is the organic photovoltaic device of example(s) 29, wherein a lowest unoccupied molecular orbital (LUMO) energy level of the first BHJ active layer is greater than a LUMO energy level of the second BHJ active layer.

Example 35 is the organic photovoltaic device of example(s) 34, wherein the LUMO energy level of the second BHJ active layer is greater than an energy level of the second electrode.

Example 36 is the organic photovoltaic device of example(s) 29, wherein a highest occupied molecular orbital (HOMO) energy level of the second BHJ active layer is less than a HOMO energy level of the first BHJ active layer.

Example 37 is the organic photovoltaic device of example(s) 29, wherein the HOMO energy level of the first BHJ active layer is less than an energy level of the first electrode.

Example 38 is the organic photovoltaic device of example(s) 29, wherein a lowest unoccupied molecular orbital (LUMO) energy level of the first BHJ active layer is within 300 meV of a LUMO energy level of the second BHJ active layer.

Example 39 is the organic photovoltaic device of example(s) 29, wherein a highest occupied molecular orbital (HOMO) energy level of the first BHJ active layer is within 300 meV of a HOMO energy level of the second BHJ active layer.

Example 40 is the organic photovoltaic device of example(s) 29, wherein the first BHJ active layer is coupled to the second BHJ active layer.

Example 41 is the organic photovoltaic device of example(s) 29, wherein the first blend is a ternary, quaternary, or higher-order blend that includes at least one of an additional electron donor material or an additional electron acceptor material.

Example 42 is the organic photovoltaic device of example(s) 29, wherein the second blend is a ternary, quaternary, or higher-order blend that includes at least one of an additional electron donor material or an additional electron acceptor material.

Example 43 is the organic photovoltaic device of example(s) 29, wherein the first BHJ active layer is coupled to the second BHJ active layer.

Example 44 is the organic photovoltaic device of example(s) 29, wherein the first BHJ active layer is coupled to the p-phenylene layer.

Numerous benefits are achieved by way of the present invention over conventional techniques. For example, embodiments of the present invention provide methods and systems for absorbing near-infrared and/or ultraviolet radiation for photovoltaic power generation while being transparent to visible light. Advantageously, these optical characteristics provide for the ability to generate electricity from incident solar radiation in a photovoltaic device, while still allowing useful visible light to be passed through, permitting a viewer to see through the photovoltaic device.

Use of short chain para-phenylenes (p-phenylenes) as an anode buffer layer is demonstrated to improve performance and color in OPVs. In some embodiments, p-quaterphenyl, p-quinquiphenyl, and p-sexiphenyl are successfully used as buffer layers in contact with a molybdenum oxide ($MoO_3$) hole injection layer. In other embodiments the p-phenylene layer can be coupled to other hole injection layers or buffers at the anode. The p-phenylene layer can also be coupled to charge recombination layers in multijunction cells.

One major electrical benefit of the p-phenylene layer is that it improves the efficiency of the solar cell specifically by increasing the photocurrent production. This is shown to be the case with at least three different D:A blend systems. Photocurrent is improved by reducing exciton recombination at the anode by spatially separating the space charge induced at the anode/organic interface and the excitons of the photoactive layers. Additionally, photocurrent may be enhanced through optical microcavity effects through tuning of the buffer thickness. Due to the high hole mobility of p-phenylenes, undoped buffer layers are demonstrated in some embodiments to function up to 50 nm in thickness without appreciable loss in performance.

Due to the wide bandgap of short chain p-phenylenes, when used as an anode buffer they effectively block electron recombination from the active layers to the anode. This results in enhanced charge selectivity of the anode, and in some embodiments, an improved fill factor (FF) and open-circuit voltage ($V_{oc}$) of the OPV.

In applications such as transparent PVs, reflected and transmitted color have a large impact on the aesthetic qualities of the PV. The ability to adjust the reflected or transmitted color independent of active layer variations is critical to manufacturing aesthetically desirable PV systems. Short chain p-phenylenes are optically transparent in the visible spectrum and can be deposited into films thick enough to engineer reflected and transmitted color in transparent PV. Due to their lack of visible or near-infrared absorption, thick layers may be deposited underneath active layers without introducing parasitic absorption within the buffer. Additionally, p-phenylene buffers help decouple active layer composition and PV color, which enables optimization of active layer blends based on performance instead of their intrinsic color. The color tuning effect of p-phenylene buffers should be even more dramatic for non-transparent PV, where microcavity effects are significantly enhanced by an optically thick metallic electrode.

These and other embodiments and aspects of the invention along with many of its advantages and features are described in more detail in conjunction with the text below and attached figures.

BRIEF DESCRIPTION OF THE DRAWINGS

FIGS. 8A-8D illustrate energy level diagrams schematically showing photovoltaic devices that incorporate a p-phenylene layer.

FIGS. 11A-11D illustrate various device structures.

FIGS. 13A-13C illustrate tables showing color parameters for different photoactive layers when a p-sexiphenyl layer is included as a buffer layer.

DETAILED DESCRIPTION OF SPECIFIC EMBODIMENTS

The present disclosure relates to organic photovoltaic devices (OPVs), and in some embodiments, visibly transparent photovoltaic devices incorporating visibly transparent photoactive compounds. The visibly transparent photoactive compounds absorb light more strongly in the near-infrared and/or ultraviolet regions and less strongly in the visible region, permitting their use in visibly transparent photovoltaic devices. The disclosed visibly transparent photovoltaic devices include visibly transparent electrodes with visibly transparent photoactive materials positioned between the visibly transparent electrodes.

Figure 1:
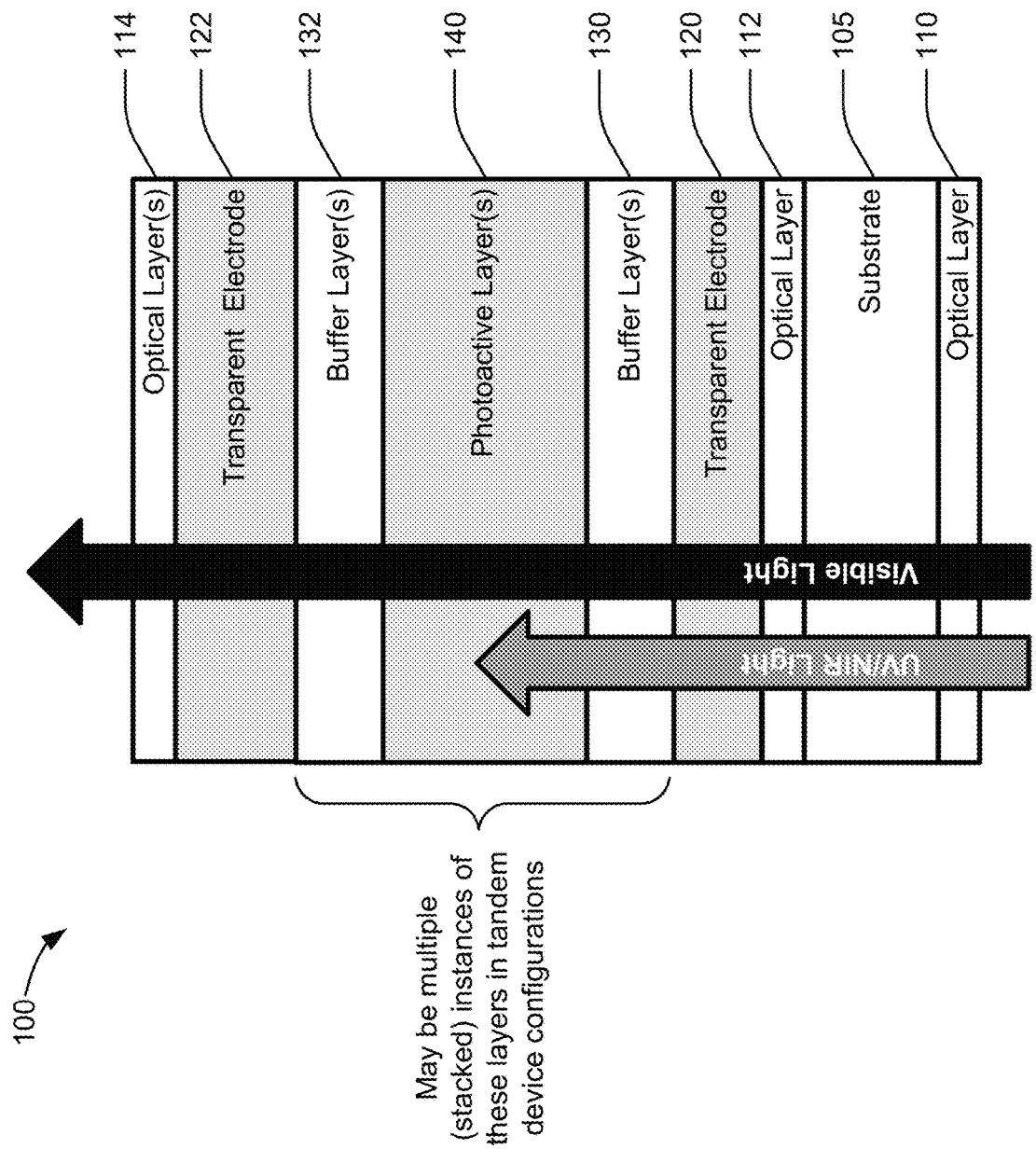
FIG. 1 illustrates a simplified schematic diagram of a visibly transparent photovoltaic device according to an embodiment of the present invention.

FIG. 1 illustrates a simplified schematic diagram of a visibly transparent photovoltaic device 100, according to an embodiment of the present invention. As illustrated in FIG. 1, visibly transparent photovoltaic device 100 includes a number of layers and elements discussed more fully below. As discussed herein, visibly transparent indicates that the photovoltaic device absorbs optical energy at wavelengths outside the visible wavelength band of 450 nm to 650 nm, for example, while substantially transmitting visible light inside the visible wavelength band. As illustrated in FIG. 1, UV and/or NIR light is absorbed in the layers and elements of the photovoltaic device while visible light is transmitted through the device. Thus, the discussion of transparency provided herein should be understood as visible transparency.

Substrate 105, which can be glass or other visibly transparent materials providing sufficient mechanical support to the other layers and structures illustrated, supports optical layers 110 and 112. These optical layers can provide a variety of optical properties, including antireflection (AR) properties, wavelength selective reflection or distributed Bragg reflection properties, index matching properties, encapsulation, or the like. Optical layers may advantageously be visibly transparent. An additional optical layer 114 can be utilized, for example, as an AR coating, an index matching later, a passive infrared or ultraviolet absorption layer, etc. Optionally, optical layers may be transparent to ultraviolet and/or near-infrared light or transparent to at least a subset of wavelengths in the ultraviolet and/or near-infrared bands. Depending on the configuration, additional optical layer 114 may also be a passive visible absorption layer. Example substrate materials include various glasses and rigid or flexible polymers. Multilayer substrates such as laminates and the like may also be utilized. Substrates may have any suitable thickness to provide the mechanical support needed for the other layers and structures, such as, for example, thicknesses from 1 mm to 20 mm. In some cases, the substrate may be or comprise an adhesive film to allow application of the visibly transparent photovoltaic device 100 to another structure, such as a window pane, display device, etc.

It will be appreciated that, although the devices overall may exhibit visible transparency, such as a transparency in the 450-650 nm range greater than 30%, greater than 40%, greater than 50%, greater than 60%, greater than 70%, or up to or approaching 100%, certain materials taken individually may exhibit absorption in portions of the visible spectrum. Optionally, each individual material or layer in a visibly transparent photovoltaic device has a high transparency in the visible range, such as greater than 30% (i.e., between 30% and 100%). It will be appreciated that transmission or absorption may be expressed as a percentage and may be dependent on the material's absorbance properties, a thickness or path length through an absorbing material, and a concentration of the absorbing material, such that a material with an absorbance in the visible spectral region may still exhibit a low absorption or high transmission if the path length through the absorbing material is short and/or the absorbing material is present in low concentration.

As described herein and below, photoactive materials in various photoactive layers advantageously exhibit minimal absorption in the visible region (e.g., less than 20%, less than 30%, less than 40%, less than 50%, less than 60%, or less than 70%), and instead exhibit high absorption in the near-infrared and/or ultraviolet regions (e.g., an absorption peak of greater than 50%, greater than 60%, greater than 70%, or greater than 80%). For some applications, absorption in the visible region may be as large as 70%. Various configurations of other materials, such as the substrate, optical layers, and buffer layers, may allow these materials to provide overall visible transparency, even though the materials may exhibit some amount of visible absorption. For example, a thin film of a metal may be included in a transparent electrode, such as a metal that exhibits visible absorption, like Ag or Cu; when provided in a thin film configuration, however, the overall transparency of the film may be high. Similarly, materials included in an optical or buffer layer may exhibit absorption in the visible range, but may be provided at a concentration or thickness where the overall amount of visible light absorption is low, providing visible transparency.

The visibly transparent photovoltaic device 100 also includes a set of transparent electrodes 120 and 122 with a photoactive layer 140 positioned between electrodes 120 and 122. These electrodes, which can be fabricated using ITO, thin metal films, or other suitable visibly transparent materials, provide electrical connection to one or more of the various layers illustrated. For example, thin films of copper, silver, or other metals may be suitable for use as a visibly transparent electrode, even though these metals may absorb light in the visible band. When provided as a thin film, however, such as a film having a thickness of 1 nm to 200 nm (e.g., about 5 nm, about 10 nm, about 15 nm, about 20 nm, about 25 nm, about 30 nm, about 35 nm, about 40 nm, about 45 nm, about 50 nm, about 55 nm, about 60 nm, about 65 nm, about 70 nm, about 75 nm, about 80 nm, about 85 nm, about 90 nm, about 95 nm, about 100 nm, about 105 nm, about 110 nm, about 115 nm, about 120 nm, about 125 nm, about 130 nm, about 135 nm, about 140 nm, about 145 nm, about 150 nm, about 155 nm, about 160 nm, about 165 nm, about 170 nm, about 175 nm, about 180 nm, about 185 nm, about 190 nm, or about 195 nm), an overall transmittance of the thin film in the visible band may remain high, such as greater than 30%, greater than 40%, greater than 50%, greater than 60%, greater than 70%, greater than 80%, or greater than 90%. Advantageously, thin metal films, when used as transparent electrodes, may exhibit lower absorption in the ultraviolet band than other semiconducting materials that may be useful as a transparent electrode, such as ITO, as some semiconducting transparent conducting oxides exhibit a band gap that occurs in the ultraviolet band and thus are highly absorbing or opaque to ultraviolet light. In some cases, however, an ultraviolet absorbing transparent electrode may be used, such as to screen at least a portion of the ultraviolet light from underlying components, as ultraviolet light may degrade certain materials.

A variety of deposition techniques may be used to generate a transparent electrode, including vacuum deposition techniques, such as atomic layer deposition, chemical vapor deposition, physical vapor deposition, thermal evaporation, sputter deposition, epitaxy, etc. Solution based deposition techniques, such as spin-coating, slot-die coating, blade coating, spray coating etc. may also be used in some cases. In addition, transparent electrodes may be patterned using techniques known in the art of microfabrication, including lithography, lift off, etching, etc.

Buffer layers 130 and 132 and photoactive layer 140 are utilized to implement the electrical and optical properties of the photovoltaic device. These layers can be layers of a single material or can include multiple sub-layers as appropriate to the particular application. Thus, the term "layer" is not intended to denote a single layer of a single material, but can include multiple sub-layers of the same or different materials. In some embodiments, buffer layer 130, photoactive layer(s) 140 and buffer layer 132 are repeated in a stacked configuration to provide tandem device configurations, such as including multiple heterojunctions. In some embodiments, the photoactive layer(s) include electron donor materials and electron acceptor materials, also referred to as donors and acceptors. These donors and acceptors are visibly transparent, but absorb outside the visible wavelength band to provide the photoactive properties of the device.

Useful buffer layers include those that function as electron transport layers, electron blocking layers, hole transport layers, hole blocking layers, exciton blocking layers, optical spacers, physical buffer layers, charge recombination layers, or charge generation layers. Buffer layers may exhibit any suitable thickness to provide the buffering effect desired and may optionally be present or absent. Useful buffer layers, when present, may have thicknesses from 1 nm to 1 μm. Various materials may be used as buffer layers, including fullerene materials, carbon nanotube materials, graphene materials, metal oxides, such as molybdenum oxide, titanium oxide, zinc oxide, etc., polymers, such as poly(3,4-ethylenedioxythiophene), polystyrene sulfonic acid, polyaniline, etc., copolymers, polymer mixtures, and small molecules, such as bathocuproine. Buffer layers may be applied using a deposition process (e.g., thermal evaporation) or a solution processing method (e.g., spin coating).

Examples of materials that can be utilized as active/buffer (transport layers)/optical materials in various embodiments of the present invention include near-IR absorbing materials, UV absorbing materials, and/or materials that are characterized by strong absorption peaks in the near-IR or UV regions of the electromagnetic spectrum. Near-IR absorbing materials include phthalocyanines, porphyrins, naphthalocyanines, squaraines, boron-dipyrromethenes, naphthalenes, rylenes, perylenes, tetracyano quinoidal thiophene compounds, tetracyano indacene compounds, carbazole thiaporphyrin compounds, metal dithiolates, benzothiadiazole containing compounds, dicyanomethylene indanone containing compounds, combinations thereof, and the like. UV absorbing materials include fullerenes, rylenes, perylenes, benzimidazoles, hexacarbonitriles, triarylamines, bistriarylamines, phenanthrolines, para-phenylenes, combinations thereof, and the like.

Figure 2:
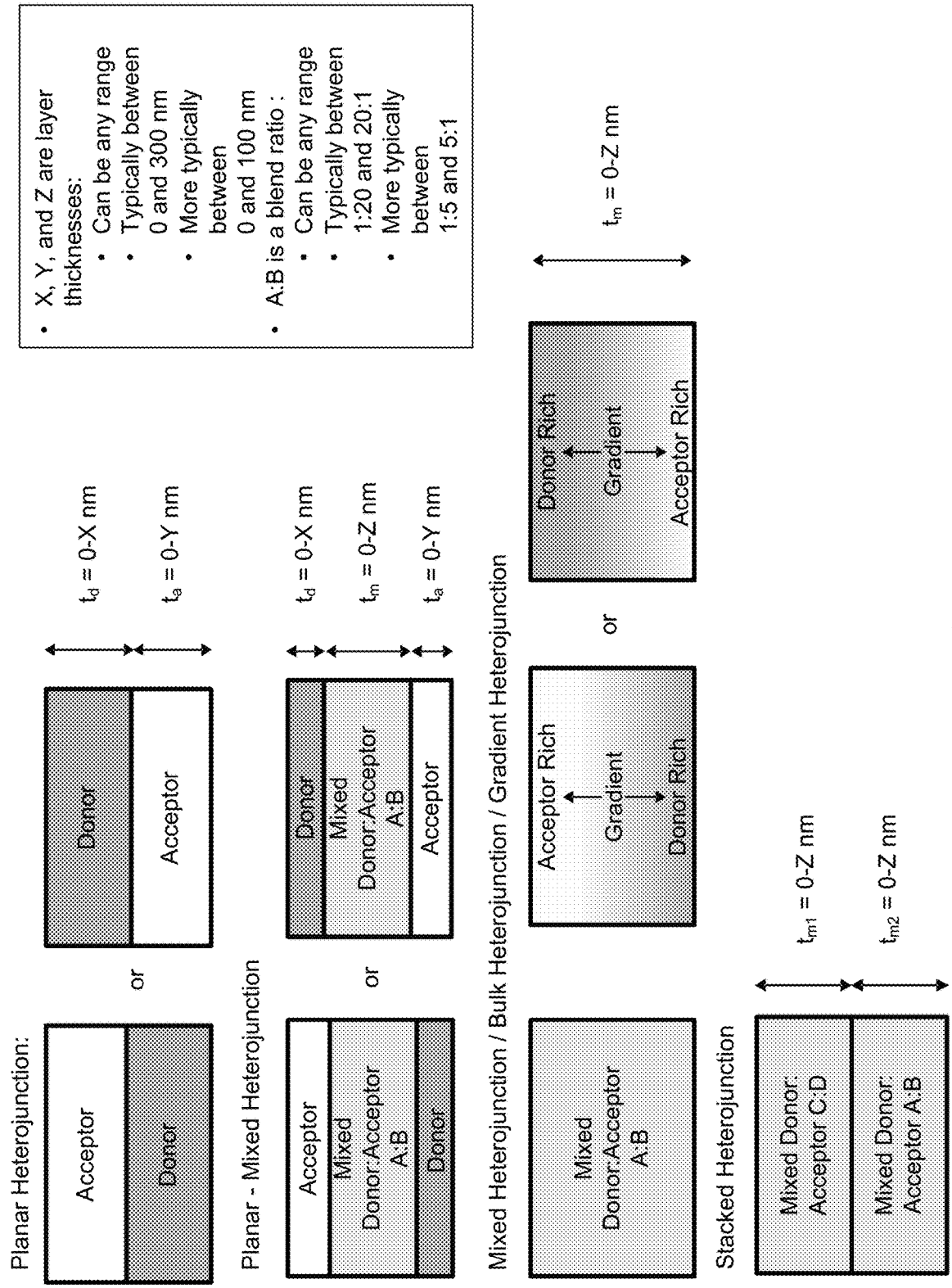
FIG. 2 illustrates an overview of various example single junction configurations for a photoactive layer.

FIG. 2 illustrates an overview of various example junction configurations for photoactive layer 140. Photoactive layer 140 may optionally correspond to mixed donor/acceptor (bulk heterojunction) configurations, planar donor/acceptor configurations, planar and mixed donor/acceptor configurations, gradient donor/acceptor configurations, or stacked heterojunction configurations. Various materials may optionally be used as the photoactive layers 140, such as materials that absorb in the ultraviolet band or the near-infrared band but that only absorb minimally, if at all, in the visible band. In this way, the photoactive material may be used to generate electron-hole pairs for powering an external circuit by way of ultraviolet and/or near-infrared absorption, leaving the visible light relatively unperturbed to provide visible transparency. As illustrated, photoactive layer 140 may comprise a planar heterojunction including separate donor and acceptor layers. Photoactive layer 140 may alternatively comprise a planar-mixed heterojunction structure including separate acceptor and donor layers and a mixed donor-acceptor layer. Photoactive layer 140 may alternatively comprise a mixed heterojunction structure including a fully mixed acceptor-donor layer or those including a mixed donor-acceptor layer with various relative concentration gradients.

Photoactive layers may have any suitable thickness and may have any suitable concentration or composition of photoactive materials to provide a desired level of transparency and ultraviolet/near-infrared absorption characteristics. Example thicknesses of a photoactive layer may range from about 1 nm to about 1 μm, about 1 nm to about 300 nm, or about 1 nm to about 100 nm. In some cases, photoactive layers may be made up of individual sub-layers or mixtures of layers to provide suitable photovoltaic power generation characteristics, as illustrated in FIG. 2. The various configurations depicted in FIG. 2 may be used and dependent on the particular donor and acceptor materials used in order to provide advantageous photovoltaic power generation. For example, some donor and acceptor combinations may benefit from particular configurations, while other donor and acceptor combinations may benefit from other particular configurations. Donor materials and acceptor materials may be provided in any ratio or concentration to provide suitable photovoltaic power generation characteristics. For mixed layers, the relative concentration of donors to acceptors is optionally between about 20 to 1 and about 1 to 20. Optionally, the relative concentration of donors to acceptors is optionally between about 5 to 1 and about 1 to 5. Optionally, donors and acceptors are present in a 1 to 1 ratio.

Various visibly transparent photoactive compounds are useful as an electron donor photoactive material and, in some embodiments, may be paired with suitable electron acceptor photoactive materials in order to provide a useful photoactive layer in the photovoltaic device. Various visibly transparent photoactive compounds are useful as an electron acceptor photoactive material, and may be paired with suitable electron donor photoactive materials in order to provide a useful photoactive layer in the photovoltaic device. Example donor and acceptor materials are described in U.S. Provisional Application Nos. 62/521,154, 62/521,158, 62/521,160, 62/521,211, 62/521,214, and 62/521,224, each filed on Jun. 16, 2017, which are hereby incorporated by reference in their entireties.

In embodiments, the chemical structure of various photoactive compounds can be functionalized with one or more directing groups, such as electron donating groups, electron withdrawing groups, or substitutions about or to a core metal atom, in order to provide desirable electrical characteristics to the material. For example, in some embodiments, the photoactive compounds are functionalized with amine groups, phenol groups, alkyl groups, phenyl groups, or other electron donating groups to improve the ability of the material to function as an electron donor in a photovoltaic device. As another example, in some embodiments, the photoactive compounds are functionalized with cyano groups, halogens, sulfonyl groups, or other electron withdrawing groups to improve the ability of the material to function as an electron acceptor in a photovoltaic device.

In embodiments, the photoactive compounds are functionalized to provide desirable optical characteristics. For example, in some embodiments, the photoactive compounds may be functionalized with an extended conjugation to redshift the absorption profile of the material. It will be appreciated that conjugation may refer to a delocalization of pi electrons in a molecule and may be characterized by alternating single and multiple bonds in a molecular structure. For example, functionalizations that extend the electron conjugation may include fusing one or more aromatic groups to the molecular structure of the material. Other functionalizations that may provide extended conjugation include alkene functionalization, such as by a vinyl group, aromatic or heteroaromatic functionalization, carbonyl functionalization, such as by an acyl group, sulfonyl functionalization, nitro functionalization, cyano functionalization, etc. It will be appreciated that various molecular functionalizations may impact both the optical and the electrical properties of the photoactive compounds.

It will be appreciated that device function may be impacted by the morphology of the active layers in the solid state. Separation of electron donors and acceptors into discrete domains, with dimensions on the scale of the exciton diffusion length and large interfacial areas, can be advantageous for achieving high device efficiency. Advantageously, the molecular framework of the photoactive materials can be tailored to control the morphology of the materials. For example, the introduction of functional groups as described herein can have large impacts to the morphology of the material in the solid state, regardless of whether such modifications impact the energetics or electronic properties of the material. Such morphological variations can be observed in pure materials and when a particular material is blended with a corresponding donor or acceptor. Useful functionalities to control morphology include, but are not limited to, addition of alkyl chains, conjugated linkers, fluorinated alkanes, bulky groups (e.g., tert-butyl, phenyl, naphthyl or cyclohexyl), as well as more complex coupling procedures designed to force parts of the structure out of the plane of the molecule to inhibit excessive crystallization.

In embodiments, other molecular structural characteristics may provide desirable electrical and optical properties in the photoactive compounds. For example, in some embodiments, the photoactive compounds may exhibit portions of the molecule that may be characterized as electron donating while other portions of the molecule may be characterized as electron accepting. Without wishing to be bound by any theory, molecules including alternating electron donating and electron accepting portions may result in redshifting the absorption characteristics of the molecule as compared to similar molecules lacking alternating electron donating and electron accepting portions. For example, alternating electron donating and electron accepting portions may decrease or otherwise result in a lower energy gap between a highest occupied molecular orbital and a lowest unoccupied molecular orbital. Organic donor and/or acceptor groups may be useful as R-group substituents, such as on any aryl, aromatic, heteroaryl, heteroaromatic, alkyl, or alkenyl group, in the visibly transparent photoactive compounds.

When the donor/acceptor materials are incorporated as a photoactive layer in a transparent photovoltaic device as either an electron donor or electron acceptor, the layer thicknesses can be controlled to vary device output, absorbance, or transmittance. For example, increasing the donor or acceptor layer thickness can increase the light absorption in that layer. In some cases, increasing a concentration of donor/acceptor materials in a donor or acceptor layer may similarly increase the light absorption in that layer. However, in some embodiments, a concentration of donor/acceptor materials may not be adjustable, such as when active material layers comprise pure or substantially pure layers of donor/acceptor materials or pure or substantially pure mixtures of donor/acceptor materials. Optionally, donor/acceptor materials may be provided in a solvent or suspended in a carrier, such as a buffer layer material, in which case the concentration of donor/acceptor materials may be adjusted. In some embodiments, the donor layer concentration is selected where the current produced is maximized. In some embodiments, the acceptor layer concentration is selected where the current produced is maximized.

However, the charge collection efficiency can decrease with increasing donor or acceptor thickness due to the increased "travel distance" for the charge carriers. Therefore, there may be a trade-off between increased absorption and decreasing charge collection efficiency with increasing layer thickness. It can thus be advantageous to select materials that have a high absorption coefficient and/or concentration to allow for increased light absorption per thickness. In some embodiments, the donor layer thickness is selected where the current produced is maximized. In some embodiments, the acceptor layer thickness is selected where the current produced is maximized.

In addition to the individual photoactive layer thicknesses, the thickness and composition of the other layers in the transparent photovoltaic device can also be selected to enhance absorption within the photoactive layers. The other layers (buffer layers, electrodes, etc.), are typically selected based on their optical properties (index of refraction and extinction coefficient) in the context of the thin film device stack and resulting optical cavity. For example, a near-infrared absorbing photoactive layer can be positioned in the peak of the optical field for the near-infrared wavelengths where it absorbs to maximize absorption and resulting current produced by the device. This can be accomplished by spacing the photoactive layer at an appropriate distance from the electrode using a second photoactive layer and/or optical layers as spacer. A similar scheme can be used for ultraviolet absorbing photoactive layers. In many cases, the peaks of the longer wavelength optical fields will be positioned further from the more reflective of the two transparent electrodes compared to the peaks of the shorter wavelength optical fields. Thus, when using separate donor and acceptor photoactive layers, the donor and acceptor can be selected to position the more red absorbing (longer wavelength) material further from the more reflective electrode and the more blue absorbing (shorter wavelength) closer to the more reflective electrode.

In some embodiments, optical layers may be included to increase the intensity of the optical field at wavelengths where the donor absorbs in the donor layer to increase light absorption and hence, increase the current produced by the donor layer. In some embodiments, optical layers may be included to increase the intensity of the optical field at wavelengths where the acceptor absorbs in the acceptor layer to increase light absorption and hence, increase the current produced by the acceptor layer. In some embodiments, optical layers may be used to improve the transparency of the stack by either decreasing visible absorption or visible reflection. Further, the electrode material and thickness may be selected to enhance absorption outside the visible range within the photoactive layers, while preferentially transmitting light within the visible range.

Optionally, enhancing spectral coverage of a visibly transparent photovoltaic device is achieved by the use of a multi-cell series stack of visibly transparent photovoltaic devices, referred to as tandem cells, which may be included as multiple stacked instances of buffer layer 130, photoactive layer 140, and buffer layer 132, as described with reference to FIG. 1. This architecture includes more than one photoactive layer, which are typically separated by a combination of buffer layer(s) and/or thin metal layers, for example. In this architecture, the currents generated in each subcell flow in series to the opposing electrodes and therefore, the net current in the cell is limited by the smallest current generated by a particular subcell, for example. The open circuit voltage ($V_{oc}$) is equal to the sum of the $V_{oc}$s of the subcells. By combining sub-cells fabricated with different donor-acceptors pairs which absorb in different regions of the solar spectrum, a significant improvement in efficiency relative to a single junction cell can be achieved.

Additional description related to the materials utilized in one or more of the buffer layers and the photoactive layers, including donor layers and/or acceptor layers, are provided below.

Figure 3:
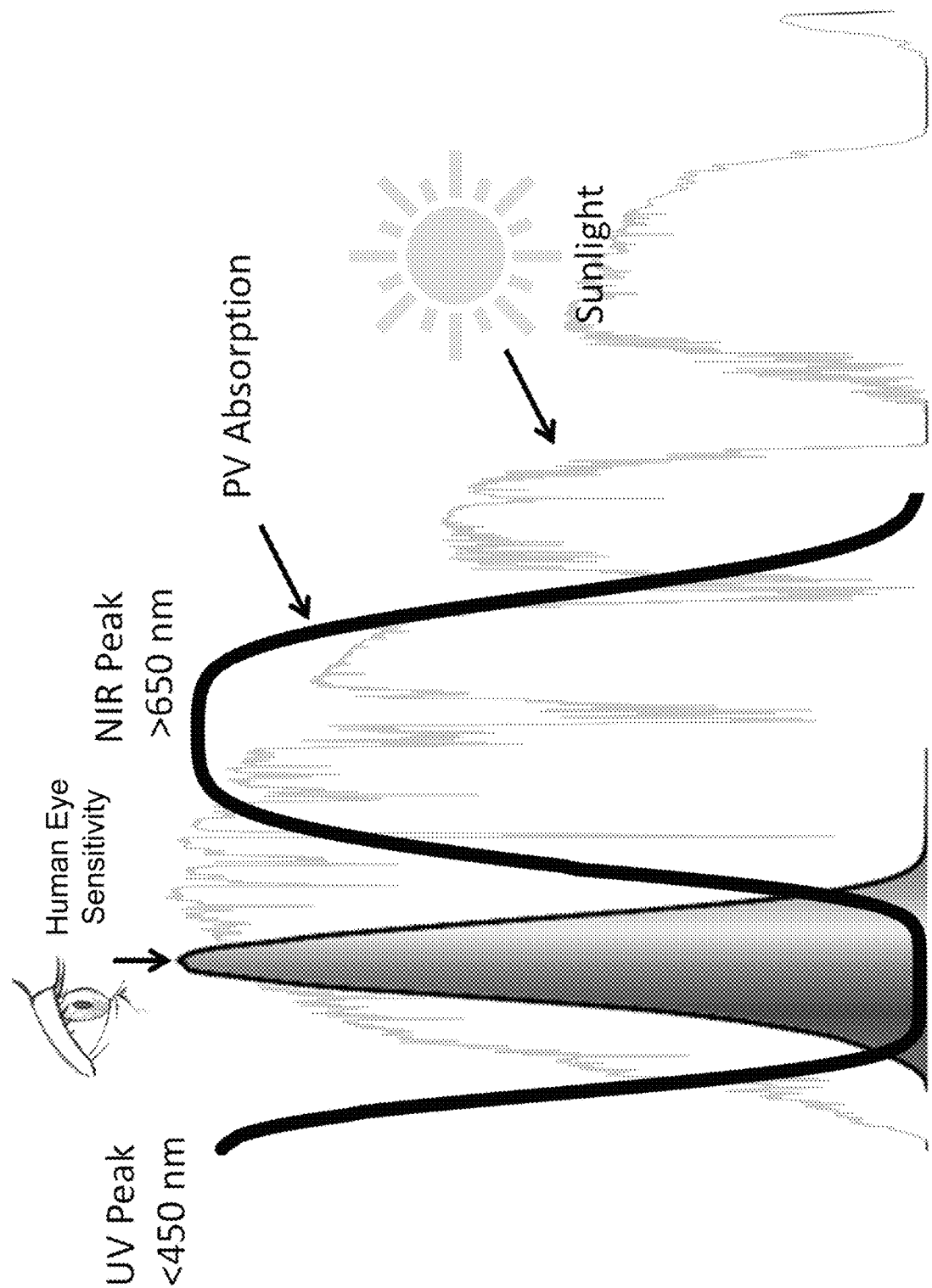
FIG. 3 illustrates a simplified plot of the solar spectrum, human eye sensitivity, and exemplary visibly transparent photovoltaic device absorption as a function of wavelength.

FIG. 3 illustrates a simplified plot of the solar spectrum, human eye sensitivity, and exemplary visibly transparent photovoltaic device absorption as a function of wavelength. As illustrated in FIG. 3, embodiments of the present invention utilize photovoltaic structures that have low absorption in the visible wavelength band between about 450 nm and about 650 nm, but absorb in the UV and NIR bands, i.e., outside the visible wavelength band, enabling visibly transparent photovoltaic operation. The ultraviolet band or ultraviolet region may be described, in embodiments, as wavelengths of light of between about 200 nm and 450 nm. It will be appreciated that useful solar radiation at ground level may have limited amounts of ultraviolet less than about 280 nm and, thus, the ultraviolet band or ultraviolet region may be described as wavelengths of light of between about 280 nm and 450 nm, in some embodiments. The near-infrared band or near-infrared region may be described, in embodiments, as wavelengths of light of between about 650 nm and 1400 nm. Various compositions described herein may exhibit absorption including a UV peak and/or a NIR peak with a maximum absorption strength in the visible region that is smaller than that in the NIR region or UV region.

Figure 4:
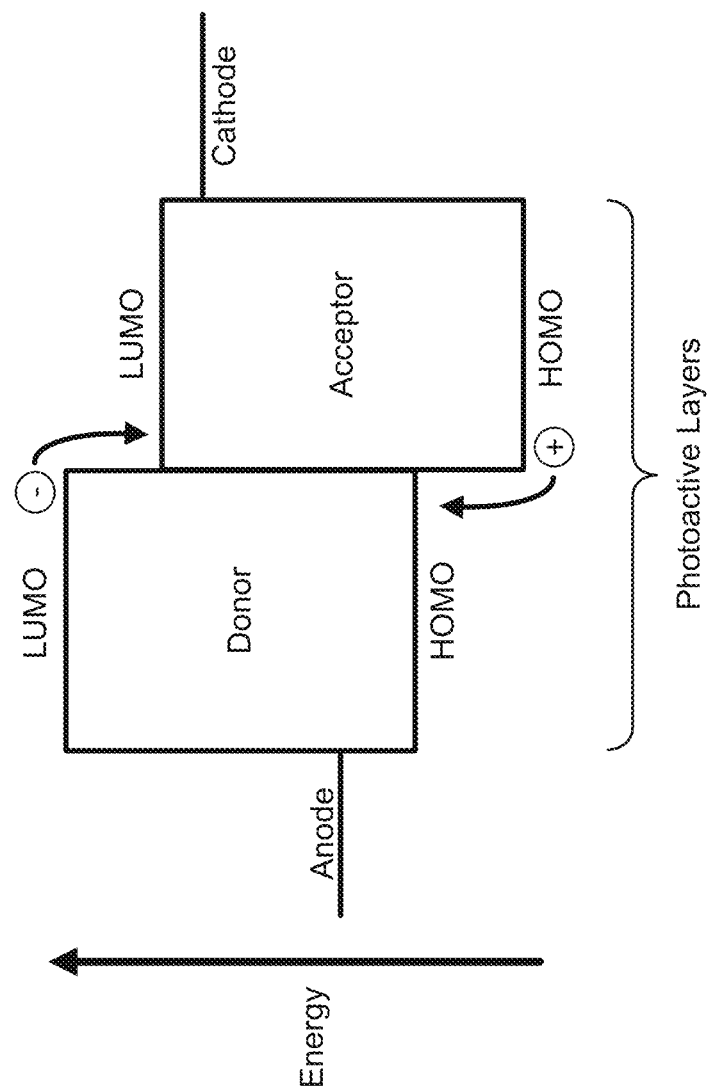
FIG. 4 illustrates a schematic energy level diagram overview for operation of an example organic photovoltaic device, such as a visibly transparent photovoltaic device.

FIG. 4 illustrates a schematic energy level diagram overview for operation of an example organic photovoltaic device, such as visibly transparent photovoltaic device 100. For example, in such a photovoltaic device, various photoactive materials may exhibit electron donor or electron acceptor characteristics, depending on their molecular properties and the types of materials that are used for buffer layers, electrodes, etc. As depicted in FIG. 4, each of the donor and acceptor materials have a HOMO and a LUMO. A transition of an electron from the HOMO to the LUMO may be imparted by absorption of photons. The energy between the HOMO and the LUMO (the HOMO-LUMO gap) of a material represents approximately the energy of the optical band gap of the material. For the electron donor and electron acceptor materials useful with the transparent photovoltaic devices provided herein, the HOMO-LUMO gap for the electron donor and electron acceptor materials preferably falls outside the energy of photons in the visible range. For example, the HOMO-LUMO gap may be in the ultraviolet region or the near-infrared region, depending on the photoactive materials. It will be appreciated that the HOMO is comparable to the valence band in conventional conductors or semiconductors, while the LUMO is comparable to the conduction band in conventional conductors or semiconductors.

The buffer layer adjacent to the donor, generally referred to as the anode buffer layer or hole transport layer, is selected such that HOMO level or valence band (in the case of inorganic materials) of the buffer layer is aligned in the energy landscape with the HOMO level of the donor to transport holes from the donor to the anode (transparent electrode). In some embodiments, it may be useful for the buffer layer to have high hole mobility. The buffer layer adjacent to the acceptor, generally referred to as the cathode buffer layer or electron transport layer, is selected such that LUMO level or conduction band (in the case of inorganic materials) of the buffer layer is aligned in the energy landscape with the LUMO level of the acceptor to transport electrons from the acceptor to the cathode (transparent electrode). In some embodiments, it may be useful for the buffer layer to have high electron mobility.

Figure 5A:
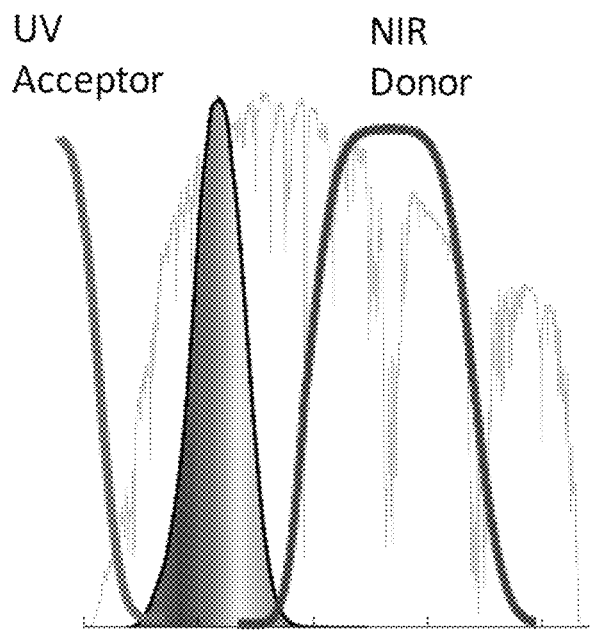
FIGS. 5A-5D illustrate various plots showing example absorption bands for different electron donor and electron acceptor configurations useful with visibly transparent photovoltaic devices.
Figure 5B:
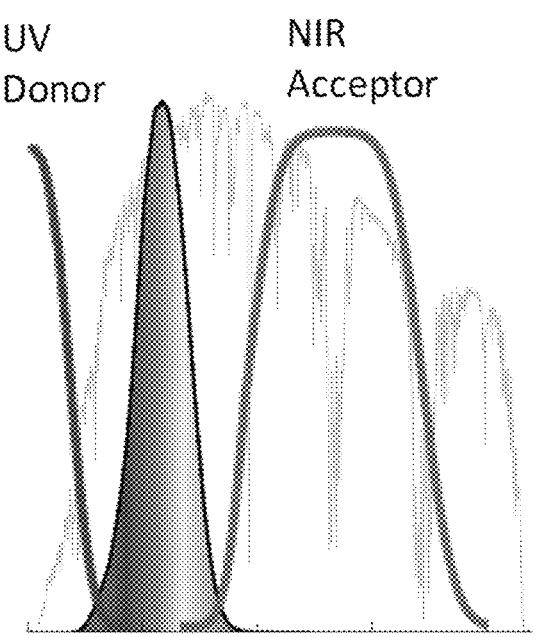

FIGS. 5A-5D illustrate various plots showing example absorption bands for different electron donor and electron acceptor configurations useful with visibly transparent photovoltaic devices. In FIG. 5A, the donor material exhibits absorption in the NIR, while the acceptor material exhibits absorption in the UV. FIG. 5B depicts the opposite configuration, where the donor material exhibits absorption in the UV, while the acceptor material exhibits absorption in the NIR.

Figure 5C:
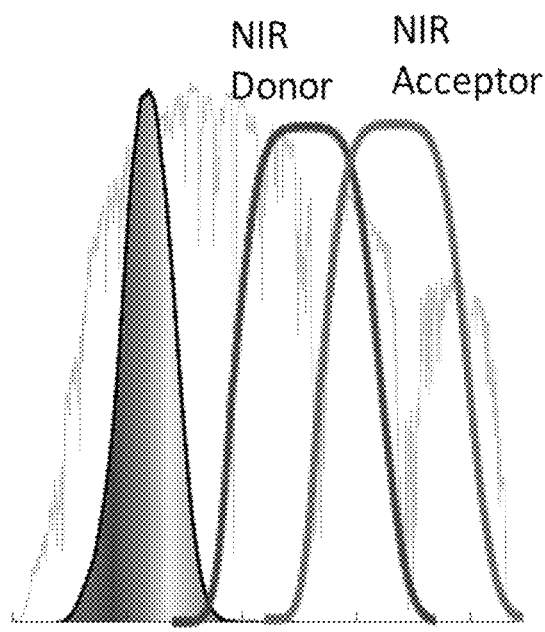
Figure 5D:
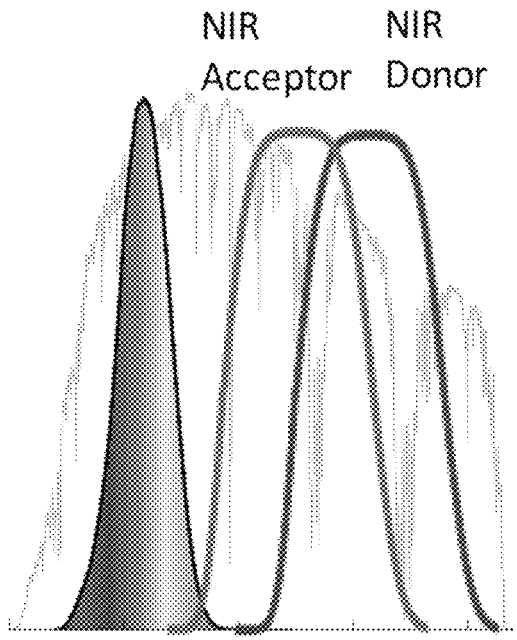

FIG. 5C depicts an additional configuration, where both the donor and acceptor materials exhibit absorption in the NIR. As illustrated in the figures, the solar spectrum exhibits significant amounts of useful radiation in the NIR with only relatively minor amounts in the ultraviolet, making the configuration depicted in FIG. 5C useful for capturing a large amount of energy from the solar spectrum. It will be appreciated that other embodiments are contemplated where both the donor and acceptor materials exhibit absorption in the NIR, such as depicted in FIG. 5D where the acceptor is blue shifted relative to the donor, opposite the configuration depicted in FIG. 5C, where the donor is blue shifted relative to the acceptor.

Figure 6:
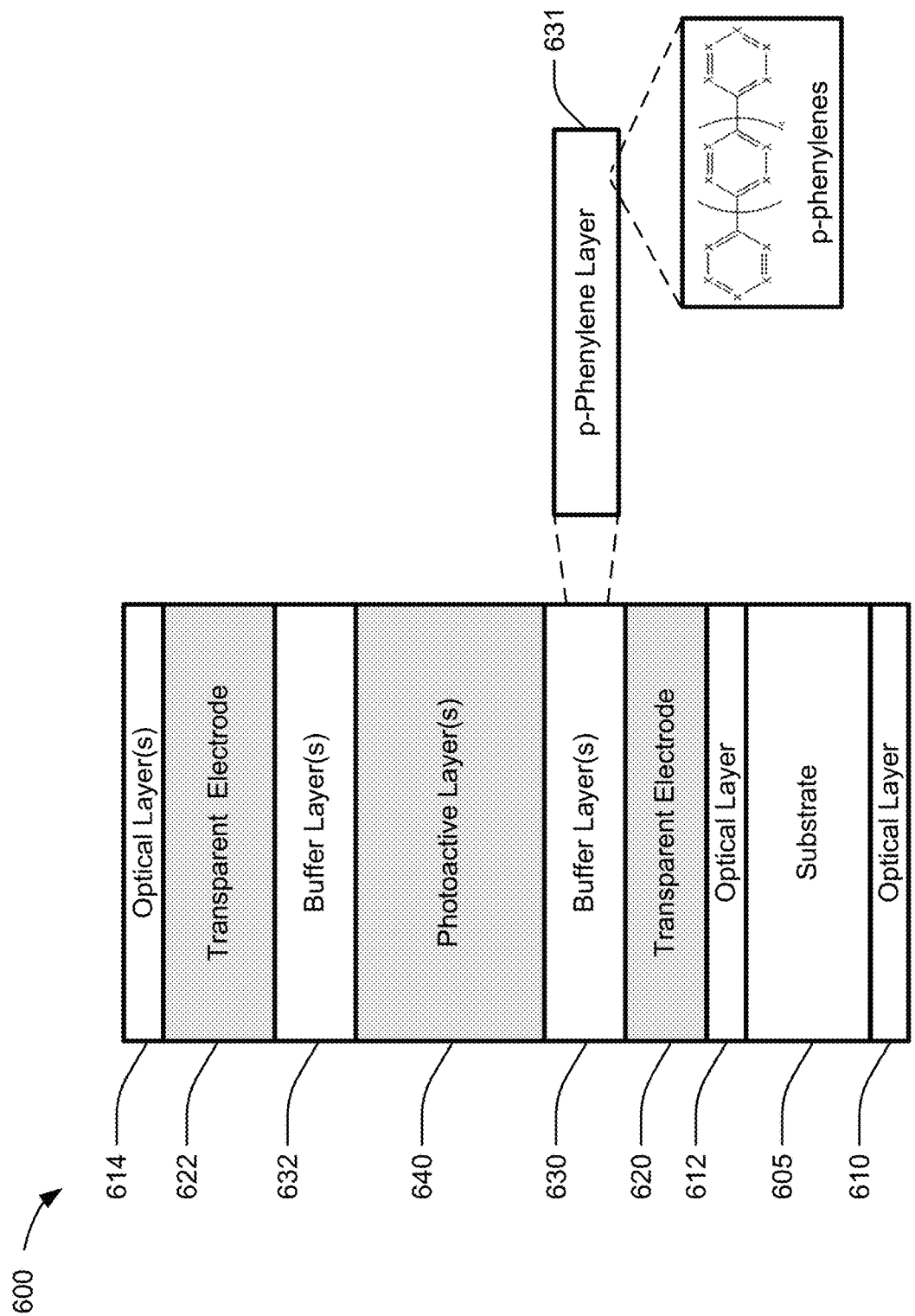
FIG. 6 illustrates a schematic diagram of a visibly transparent photovoltaic device, according to an embodiment of the present invention.

FIG. 6 illustrates a schematic diagram of a visibly transparent photovoltaic device 600, according to an embodiment of the present invention. Photovoltaic device may include a substrate 605, optical layers 610 and 612, a transparent electrode 620, buffer layer(s) 630, photoactive layer(s) 640, buffer layer(s) 632, a transparent electrode 622, and optical layer(s) 614, which may be similar to components previously described herein. For example, photoactive layers 640 may include a first bulk heterojunction (BHJ) active layer and a second BHJ active layer.

Between photoactive layers 640 and transparent electrodes 622, various types of buffer layers 630 and 632 may be used to provide optical, electronic, or morphological benefits leading to improved solar cell performance, aesthetics, fabrication, or stability. Ideally, these interlayers provide all these benefits. Organic solar cells can utilize single or multilayer buffers comprising a large variety of materials. At the anode, interlayers that can be utilized include poly(3,4-ethylenedioxythiophene) polystyrene sulfonate (PEDOT:PSS), which is a conductive transparent polymer blend, and $MoO_3$. A variety of other materials, including doped and undoped organic semiconductors can offer various advantages for various photoactive layer stacks.

In some embodiments of the present invention, a p-phenylene material is utilized as an anode buffer layer for improved performance and color in transparent solar cells. Specifically, a thin 2-50 nm thick p-phenylene layer 631 (containing a p-phenylene material) can be deposited by thermal evaporation between the $MoO_3$ or other anode buffer layer and photoactive layers 640. In some embodiments, the p-phenylene layer can be paired with other organic HTL materials (non-inorganic oxides) such as HAT-CN. One major electrical benefit of the p-phenylene layer is that it improves the efficiency of the cell specifically by increasing the photocurrent production. This can be demonstrated with three different D:A blend systems, three different p-phenylene materials and two different buffers as shown in reference to FIGS. 12A-12D and 13A-13C.

In some embodiments, the p-phenylene material has a formula of:

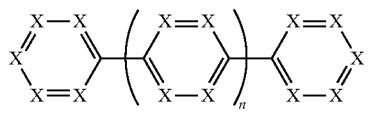

where each X is independently C—R or N, where n is 1, 2, 3, 4, or 5, and where each R is independently H, F, Cl, Br, $CH_3$, $OCH_3$, $Si(CH_3)_3$, $NH_2$, OH, SH, CN, or $CF_3$.

Figure 7A:
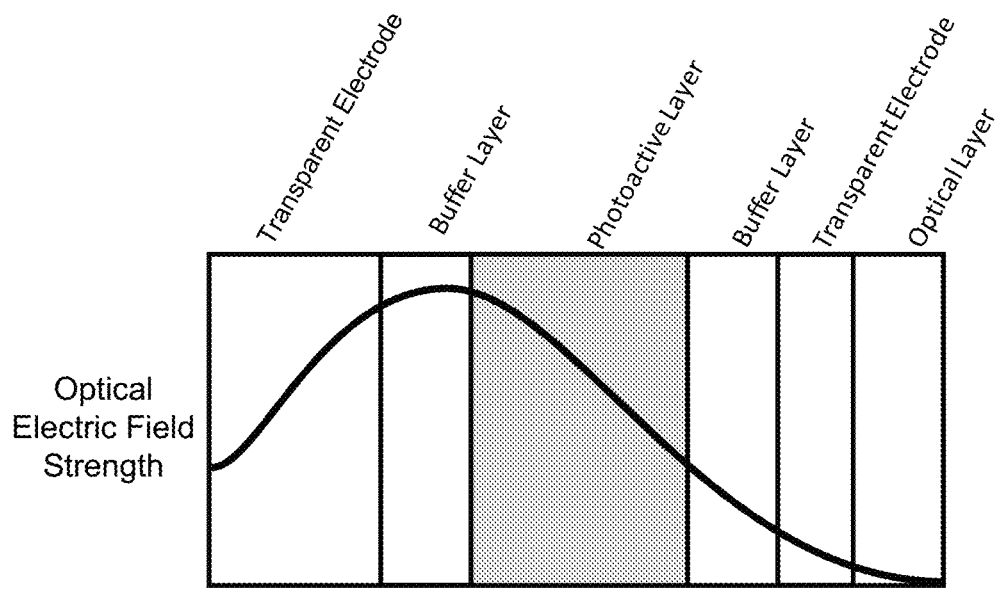
FIGS. 7A and 7B illustrate the effect of adding a p-phenylene layer on the optical electric field strength across layers of a photovoltaic device.
Figure 7B:
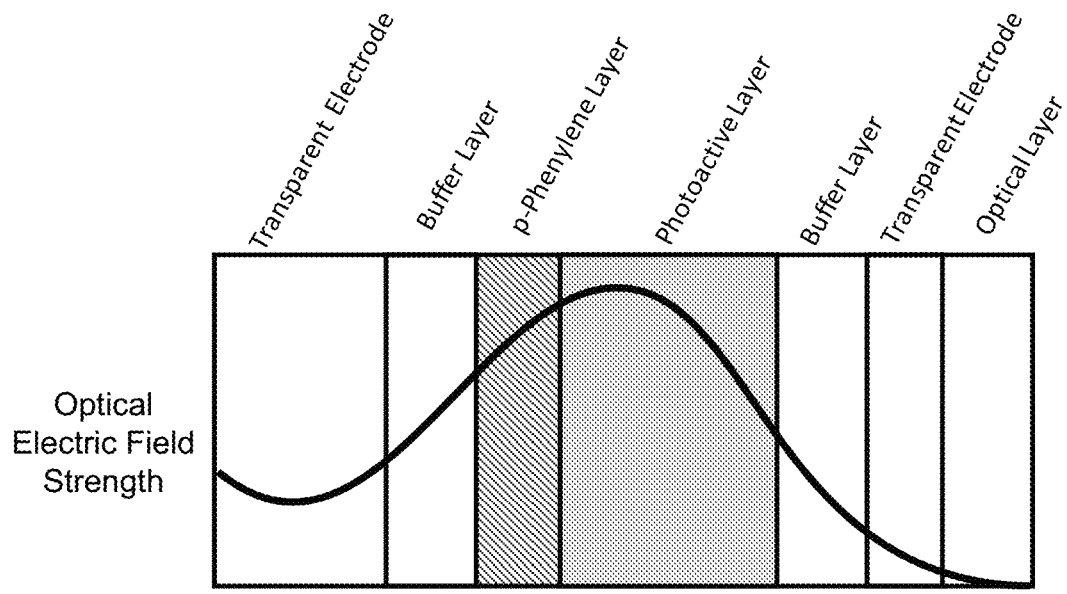

In some embodiments, buffer layers 630 may include a hole injection layer disposed between transparent electrode 620 and p-phenylene layer 631. Possible hole injection layers include, but are not limited to: $MoO_x$, $NiO_x$, $CuO_x$, $VO_x$, $WO_x$, $CoO_x$, $CrO_x$, $Li:NiO_x$, $Mg:NiO_x$, $Cs:NiO_x$, $Cu:CrO_x$, $Cr_yCu_zO_x$, LiMgLiO, CuSCN, CuI, $BiI_3$, Graphene, Graphene Oxide, and $MoS_2$, corresponding to both stoichiometric and non-stoichiometric compositions FIGS. 7A and 7B illustrate the effect of adding a p-phenylene layer on the optical electric field strength across layers of a photovoltaic device. In reference to FIG. 7A, the optical electric field strength has a maximum value within the buffer layer, and steadily decreases across the photovoltaic layer. When the p-phenylene layer is added to the photovoltaic device of FIG. 7A, between the previous buffer layer and the photoactive layer, the optical electric field strength increases across the buffer layer and the p-phenylene layer, and has a maximum value within the photoactive layer, as shown in reference to FIG. 7B. Accordingly, the effect of adding the p-phenylene layer is that the maximum optical electric field strength is shifted toward the photoactive layer.

The shift in the optical electric field strength is one of several mechanisms responsible for the efficiency enhancement seen in the solar cells with the addition of a p-phenylene layer, which can be demonstrated to be as significant as a 10% increase in current. Some mechanisms are related to the optical effects of adding this transparent layer into the stack. As thin film solar cells rely on cavity effects and adding layers changes the optical electric field distribution within the stack. By adjusting the thickness of the p-phenyl layer, photogeneration within the active layer can be enhanced by changing the spatial distribution of the optical electric field intensity at appropriate wavelengths. In addition to optical effects, the p-sexiphenyl may help to reduce recombination by electrostatic decoupling of the electrode from the active layer. This is achieved by reducing the effect of the image potential near the electrode interface, and the density of states broadening present at organic/electrode interfaces, while still allowing Fermi-level alignment for efficient charge collection. This effect is due to the HOMO and LUMO levels of the material, as shown in reference to FIGS. 8A-8D. Finally, p-phenylene layers can be shown to help orient materials deposited on top of the p-phenylene layers. The strong alignment of the rod-like p-phenylene molecules and growth of highly-oriented grains leads to preferential orientation of subsequent layers. This templating may lead to improved optical quality of the device and improved charge generation and transport.

Figure 8A:
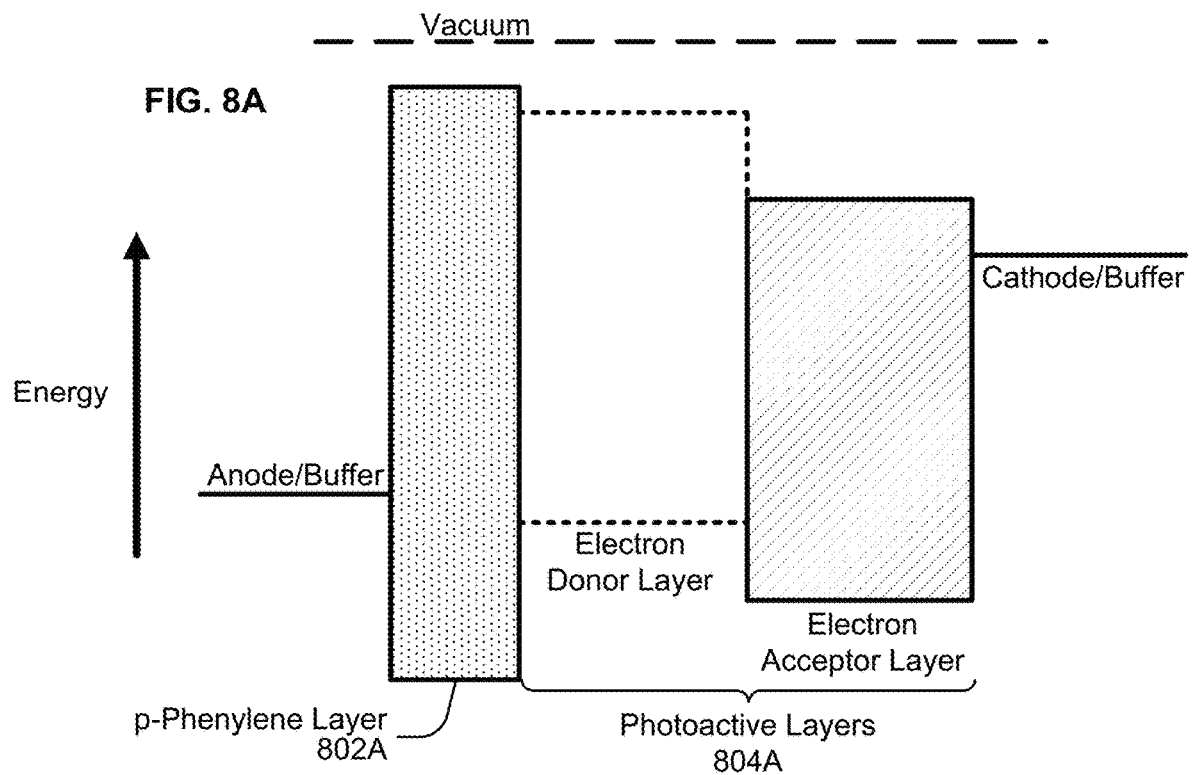
Figure 8B:
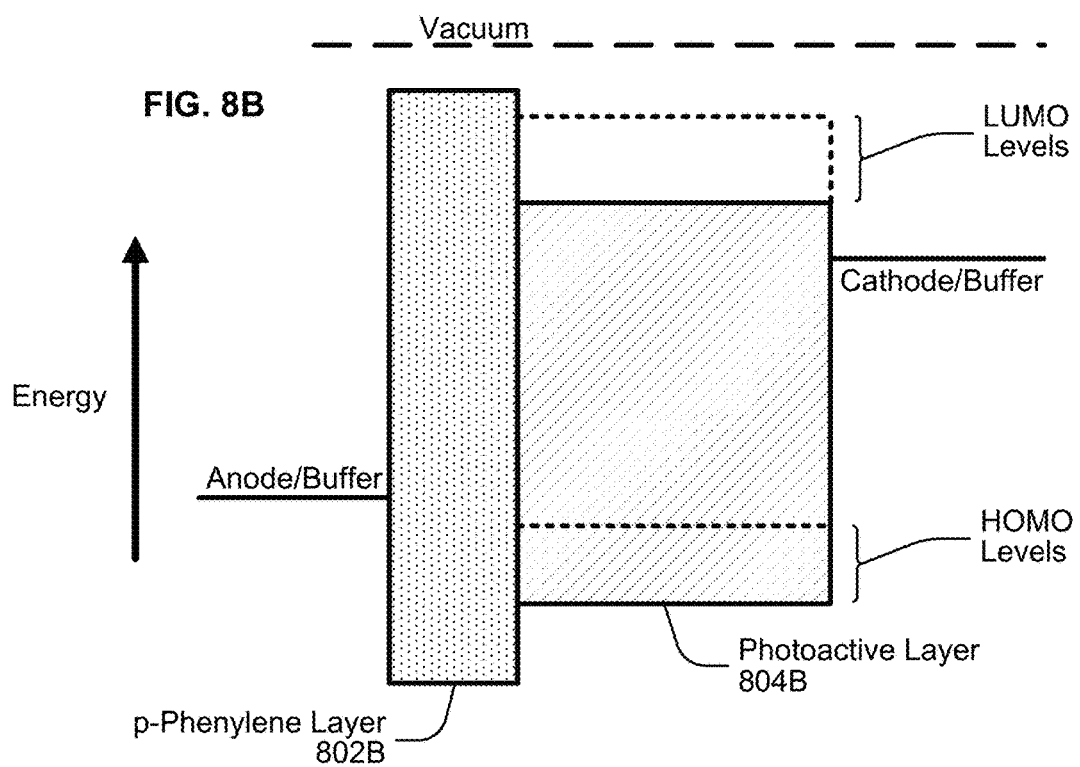

FIGS. 8A-8D illustrate energy level diagrams schematically showing photovoltaic devices that incorporate a p-phenylene layer. FIG. 8A illustrates an energy level diagram for a photovoltaic device having a p-phenylene layer 802A and planar photoactive layers 804A including an electron donor layer and an electron acceptor layer. FIG. 8B illustrates an energy level diagram for a photovoltaic device having a p-phenylene layer 802B and a BHJ photoactive layer 804B.

The photovoltaic device in FIG. 8C differs from FIG. 8B in that the photoactive layer 804C comprises a stacked BHJ containing two BHJ layers with dissimilar electron donor materials. FIG. 8D illustrates an energy level diagram for a tandem photovoltaic device having a p-phenylene layer 802D and BHJ photoactive layer 804D within each subcell.

For all devices, exciton and charge recombination at the anode is reduced by the addition of the p-phenylene layer through the electrostatic decoupling of the electrode from the active layer. This effect is due to the low-lying HOMO level of the material, which is deeper than the HOMO levels of the photoactive layers. Furthermore, the shallow LUMO level helps the material to serve as effective electron blocking layer.

Figure 9:
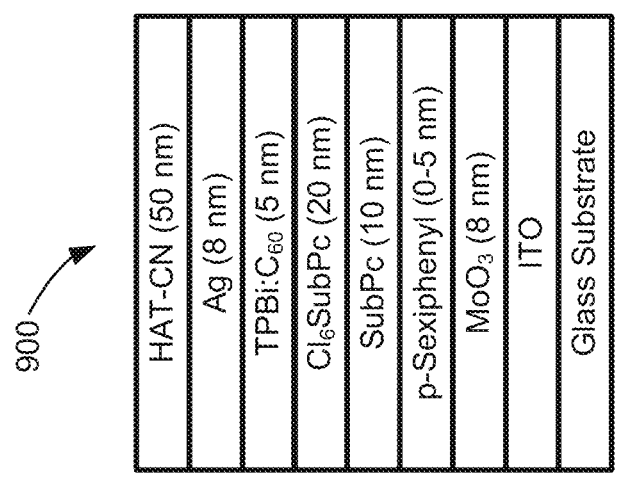
FIG. 9 illustrates a planar device structure, according to certain embodiments of the present invention.

FIG. 9 illustrates a planar heterojunction device structure 900 incorporating a p-sexiphenyl layer. The active layers are comprised by an electron donor, SubPc, and an electron acceptor, $Cl_6SubPc$. A 5 nm p-sexiphenyl layer is inserted between the $MoO_3$ and donor layers, inhibiting charge carriers and excitons from recombining at the $MoO_3$/SubPc interface.

Figure 10:
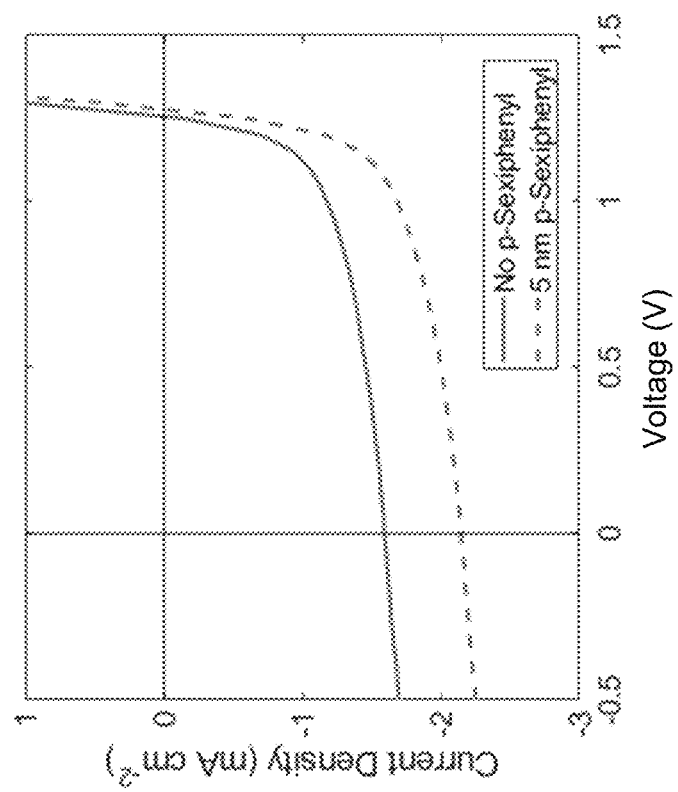
FIG. 10 illustrates current density-voltage curves.

FIG. 10 illustrates current density-voltage curves for $SubPc/Cl_6SubPc$ planar heterojunction devices as a function of p-sexiphenyl thickness tested under simulated AM1.5G illumination. As shown in FIG. 10, all device parameters ($J_{sc}$, $V_{oc}$, FF, and PCE) are enhanced by the inclusion of a thin p-sexiphenyl layer. Most notably, the $J_{sc}$ is increased from 1.6 to 2.2 mA $cm^{-2}$ due to the elimination of exciton and charge recombination at the $MoO_3$/SubPc donor interface, resulting in an improvement in PCE from 1.7 to 2.2%. This further highlights the compatibility of p-phenylene buffers with high-$V_{oc}$ devices.

FIGS. 11A-11D illustrate device structures 1100 for different BHJ and stacked BHJ devices incorporating a p-phenylene layer of varying thickness. In each case, the p-phenylene layer may be composed of p-quaterphenyl, p-quinquiphenyl, or p-sexiphenyl, according to certain embodiments. The BHJ device in FIG. 11B differs from the BHJ device in FIG. 11A by the choice of active layers, while the stacked BHJ device in FIG. 11D differs from the stacked BHJ device in FIG. 11C by the choice of anode buffer layer (HAT-CN versus $MoO_3$, respectively).

Figure 12A:
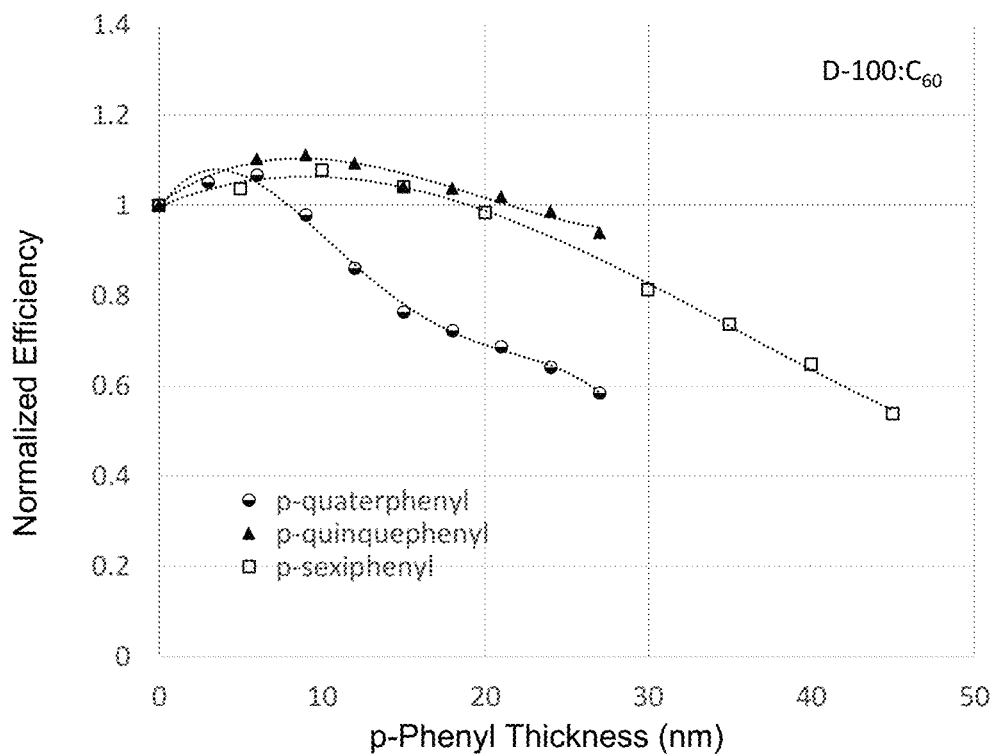
FIGS. 12A-12D illustrate efficiencies for different photoactive layers as a function of the thickness of a p-sexiphenyl layer.
Figure 12B:
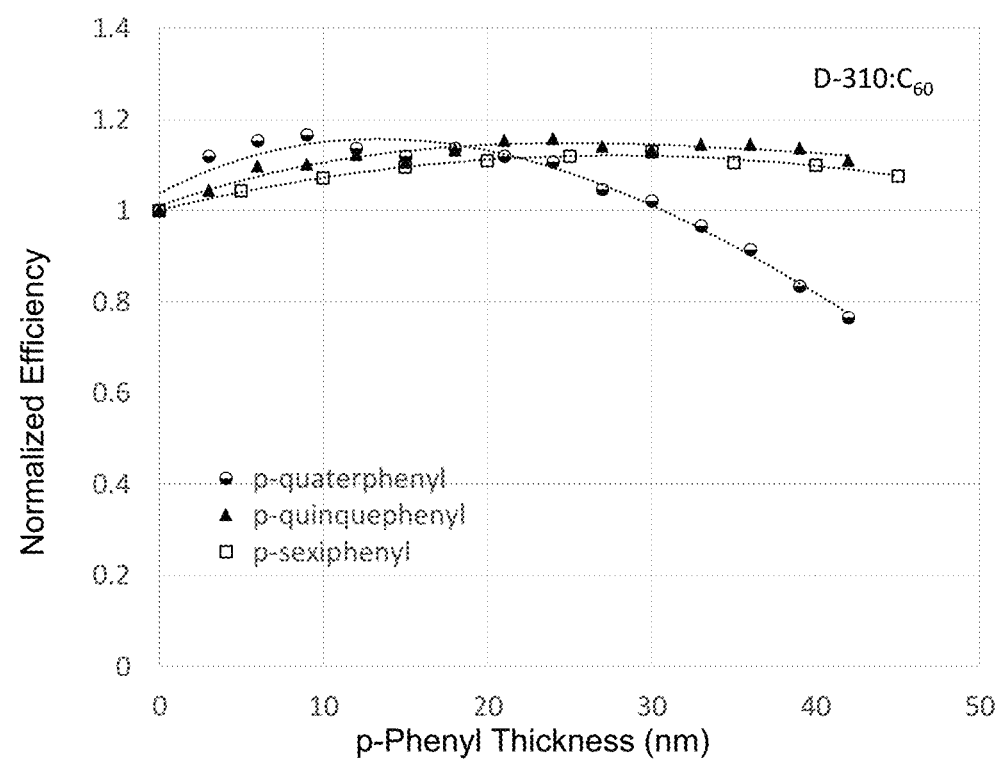

FIGS. 12A-12D illustrate device efficiencies for different BHJ and stacked BHJ photoactive layers as a function of the thickness of p-phenylene layer 631 relative to without a p-phenylene layer. As shown in FIG. 12A, the D-100:$C_{60}$ photoactive layer has a maximum normalized efficiency around 1.1 at a layer thickness of 10 nm compared to a normalized efficiency of unity without a p-sexiphenyl layer. In a second example, the device is improved from a normalized efficiency of unity to ~1.1 by inserting a 9 nm p-quinquephenyl layer. In a third example, the normalized efficiency of the device is improved by inserting a 6 nm p-quaterphenyl layer. As shown in FIG. 12B, the D-310:$C_{60}$ photoactive layer has a maximum normalized efficiency of ~1.2 at a layer thickness of 30 nm compared to a normalized efficiency of unity without a p-sexiphenyl layer. In a second example, the device is improved ~20% by inserting a 24 nm p-quinquephenyl layer. In a third example, the device is improved to a normalized efficiency of ~1.1 by inserting an 18 nm p-quaterphenyl layer.

Figure 12C:
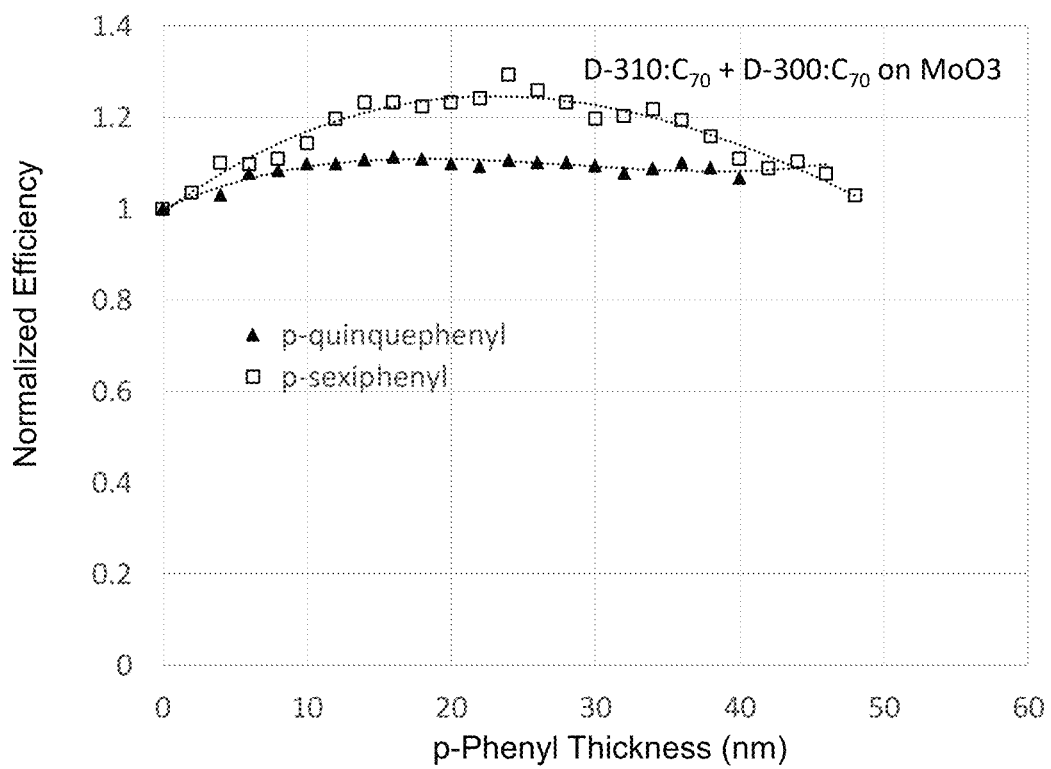
Figure 12D:
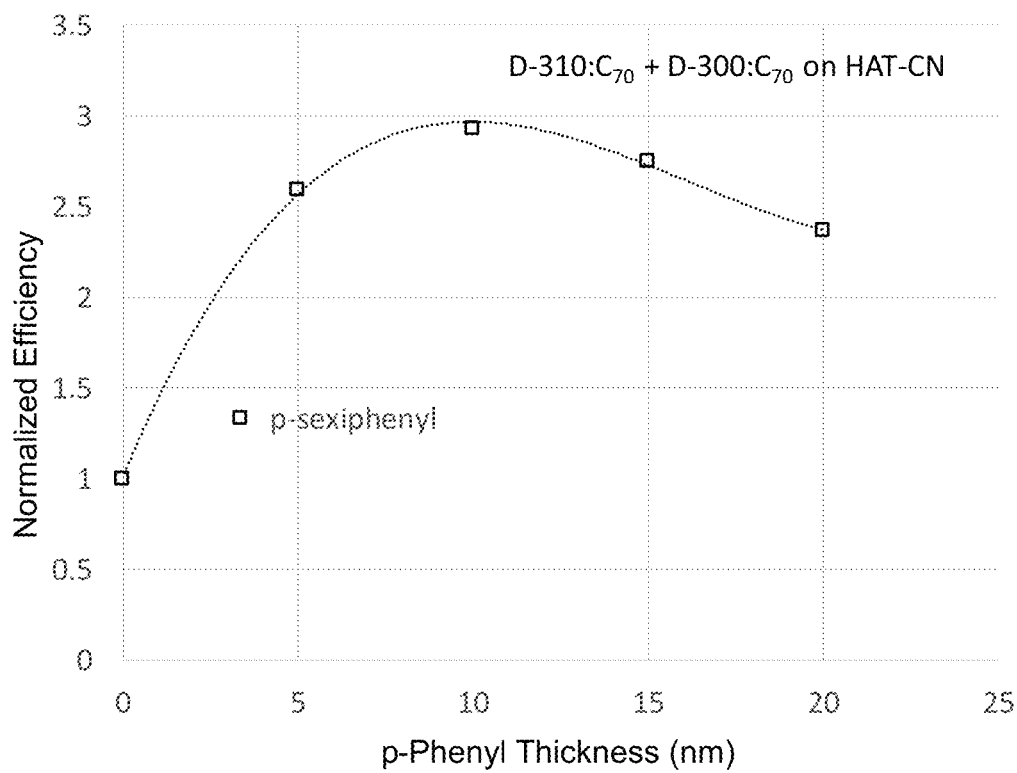

As shown in FIG. 12C, the stacked BHJ comprising a combined D-310:$C_{70}$ and D-300:$C_{70}$ BHJ photoactive layer has a maximum normalized efficiency of ~1.3 at a layer thickness of 24 nm deposited on a $MoO_3$ layer compared to a normalized efficiency of unity without a p-sexiphenyl layer. In a second example, the device is improved ~10% by inserting an 18 nm p-quinquephenyl layer. As shown in FIG. 12D, the stacked BHJ comprising D-310:$C_{70}$ and D-300:$C_{70}$ BHJs photoactive layer using an alternative anode buffer layer HAT-CN, has a maximum efficiency around 3 at a layer thickness of 24 nm compared to a normalized efficiency of unity without p-sexiphenyl layer. An improved efficiency can be observed in each of FIGS. 12A-12D by comparing the efficiency at a layer thickness of 0 nm (e.g., not including p-phenyl layer 631) to the maximum efficiency with each of the phenylene layers. In each individual example, all other layers are held constant such that the improvement is specifically due to the insertion of the p-phenylene layer.

FIGS. 13A-13C illustrate tables showing CIELAB color parameters and the average visible reflection (AVR) for different photoactive layers for the case where a p-sexiphenyl layer is included (bottom rows) and the case where a p-sexiphenyl layer is not included (middle rows). In addition to improving electrical performance, the p-sexiphenyl layer can also be used to tune the glass-side reflected color of transparent solar cells. Glass-side reflected color is an important device parameter for window manufactures. In general, a more negative b* value for glass-side reflected color is desirable. For some of the D:A systems described herein, incorporating p-sexiphenyl leads to a more negative b* value, as shown for D-100:$C_{60}$ devices (FIG. 13A) and stacked BHJs comprising D-310:$C_{60}$ and D-300:$C_{60}$ BHJs (FIG. 13C).

Color parameters shown in FIGS. 13A-13C may vary based on the thickness of the p-sexiphenyl layer. Accordingly, the p-sexiphenyl layer may act as a color tuning layer in addition to a buffer layer, allowing the layer thickness to be calibrated so as to produce a desired efficiency (as shown in reference to FIGS. 12A-12D) and/or a desired color characteristic (as shown in reference to FIGS. 13A-13C). For example, in some implementations, a* and/or b* values between −10 and 0 may be preferable. In such implementations, a maximum efficiency may be found by varying the thickness, while additionally satisfying the color preferences.

Figure 14:
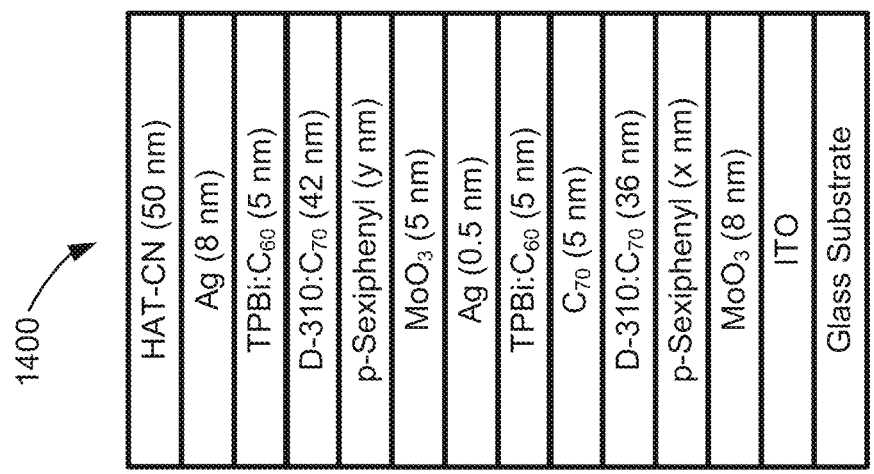
FIG. 14 illustrates a tandem device structure, according to certain embodiments of the present invention.

FIG. 14 illustrates a tandem device structure 1400 comprising two subcells with p-sexiphenyl layers of varying thickness. The active layers of both subcells are D-310:$C_{70}$ BHJs which are electrically connected in series through a central charge recombination zone (CRZ). The CRZ is formed by a layered structure of TPBi:$C_{60}$, Ag, and $MoO_3$ that serves as both the cathode for the bottom subcell and anode for the top subcell. The p-sexiphenyl layers are inserted between the anode and active layers in both subcells.

Figure 15:
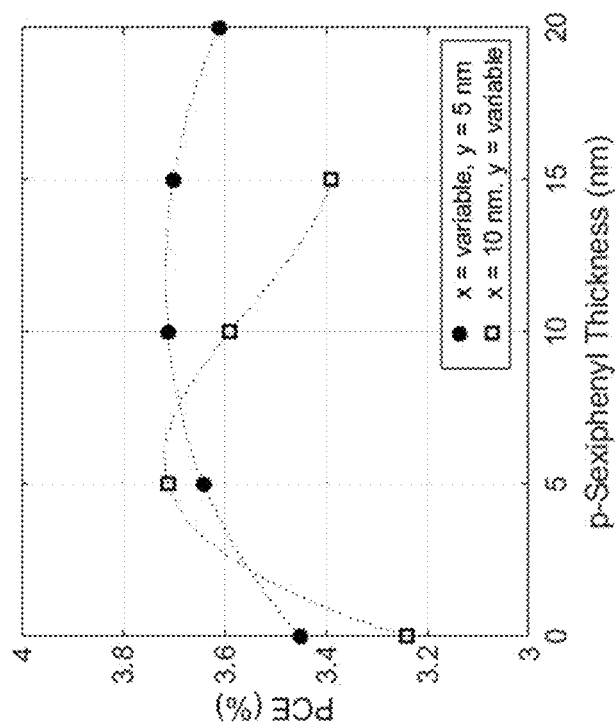
FIG. 15 illustrate efficiencies for a tandem device structure as a function of the thickness of p-sexiphenyl layers.

FIG. 15 illustrates the PCE of the tandem device structure as a function of p-sexiphenyl thickness for either the bottom subcell (x) or top subcell (y). As can be seen, the elimination of the p-sexiphenyl layer in either subcell results in a significant loss in performance up to 10-20% compared to the peak value. The optimal p-sexiphenyl thickness for the bottom subcell is 10 nm, while the optimal thickness for the top subcell is 5 nm, resulting in a maximum PCE of 3.7%. Deviation from this optimum causes a significant reduction in performance, particularly for the top subcell.

Figure 16B:
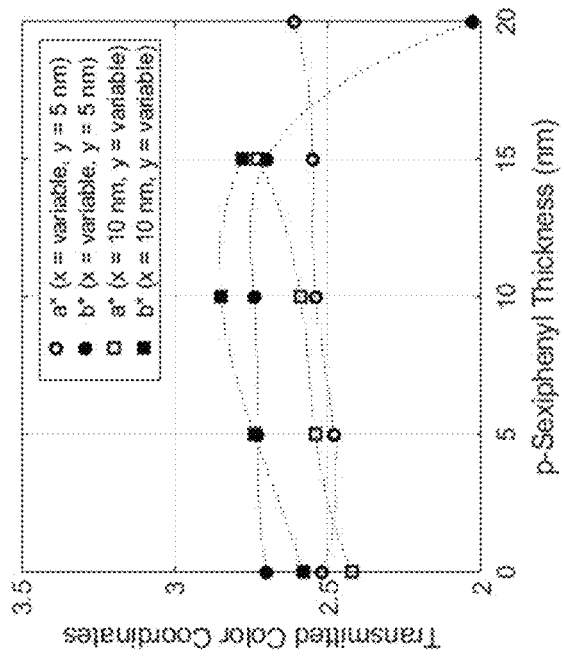
FIGS. 16A and 16B illustrate reflected and transmitted color coordinates for tandem devices with p-sexiphenyl layers having different thicknesses.
Figure 16A:
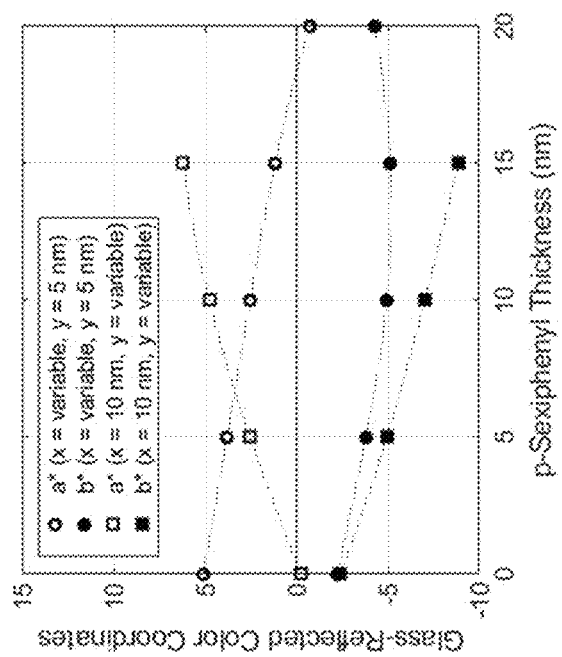

FIGS. 16A and 16B illustrate the reflected and transmitted CIELAB color parameters for the tandem device structure as a function of p-sexiphenyl thickness for either the bottom subcell (x) or top subcell (y). As can be seen in FIG. 16A, the reflected color is very sensitive to p-sexiphenyl thickness in both subcells, which causes a shift in reflected a* by up to 7 over the 20 nm range investigated. Similarly the reflected b* can be shifted negative by up to 7 from the p-phenylene in the top subcell. As shown in FIG. 16B, transmitted a* and b* values do not vary by more than 1 across the range of p-phenylene thicknesses, demonstrating that the p-phenylene layers permit independent control of the glass-reflected color with negligible impact on transmitted color.

Figure 17:
FIG. 17 illustrates a solution-processed bulk heterojunction (BHJ) device structure.

FIG. 17 illustrates a BHJ device structure 1700 employing a solution-processed active layer and a p-sexiphenyl layer of varying thickness. The PCE10:COi8DFIC:$PC_{71}BM$ active layer is applied by spin-coating from solution on the p-sexiphenyl coated substrate.

Figure 18:
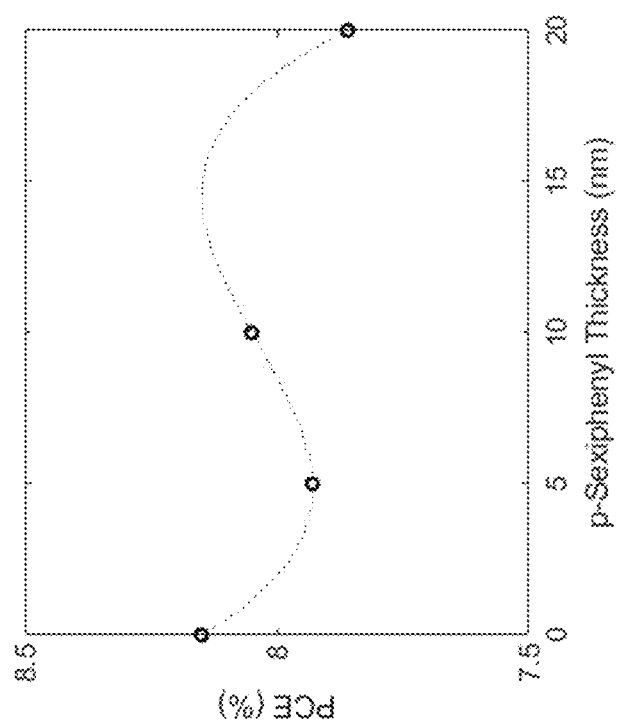
FIG. 18 illustrates efficiencies as a function of the thickness of a p-sexiphenyl layer.

FIG. 18 illustrates the solution-processed device efficiency as a function of the p-sexiphenyl layer thickness. PCE is relatively stable (within 5% deviation) with p-sexiphenyl thickness up to 20 nm, allowing for color tuning without significant performance loss. Due to the low solubility of p-sexiphenyl and other p-phenylenes and their orthogonality to most common organic solvents used for solution processing OPVs, the p-sexiphenyl layers are not removed during the spin-coating process. Thus p-phenylene buffer layers are compatible with both solution and vacuum-processed devices.

Figures 19A, 19B:
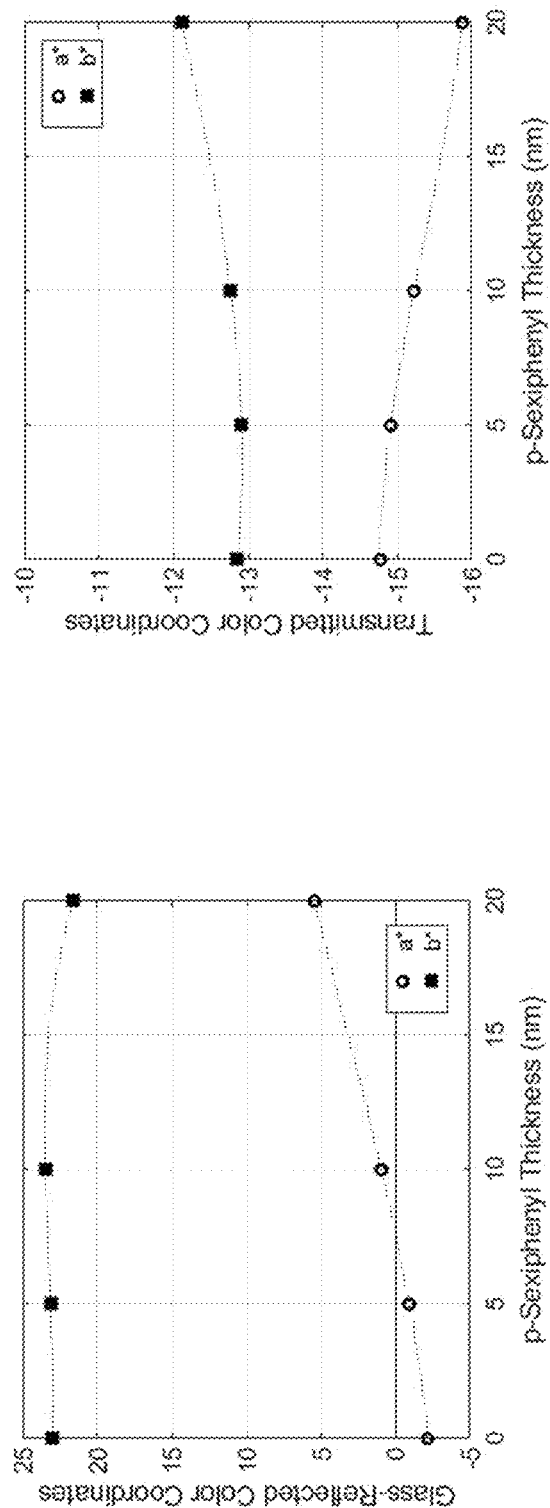
FIGS. 19A and 19B illustrate reflected and transmitted color coordinates for p-phenylene layers having different thicknesses.

FIGS. 19A and 19B illustrate the reflected and transmitted CIELAB color parameters for the solution-processed devices as a function of p-sexiphenyl thickness. As can be seen in FIG. 19A, the reflected a* can be shifted by over 7 over the 20 nm range investigated. As shown in FIG. 19B, transmitted a* and b* values do not vary by more than 1 across the range of p-phenylene thicknesses, demonstrating that the p-phenylene layers permit independent control of the glass-reflected color with negligible impact on transmitted color in solution-processed devices.

Figure 20:
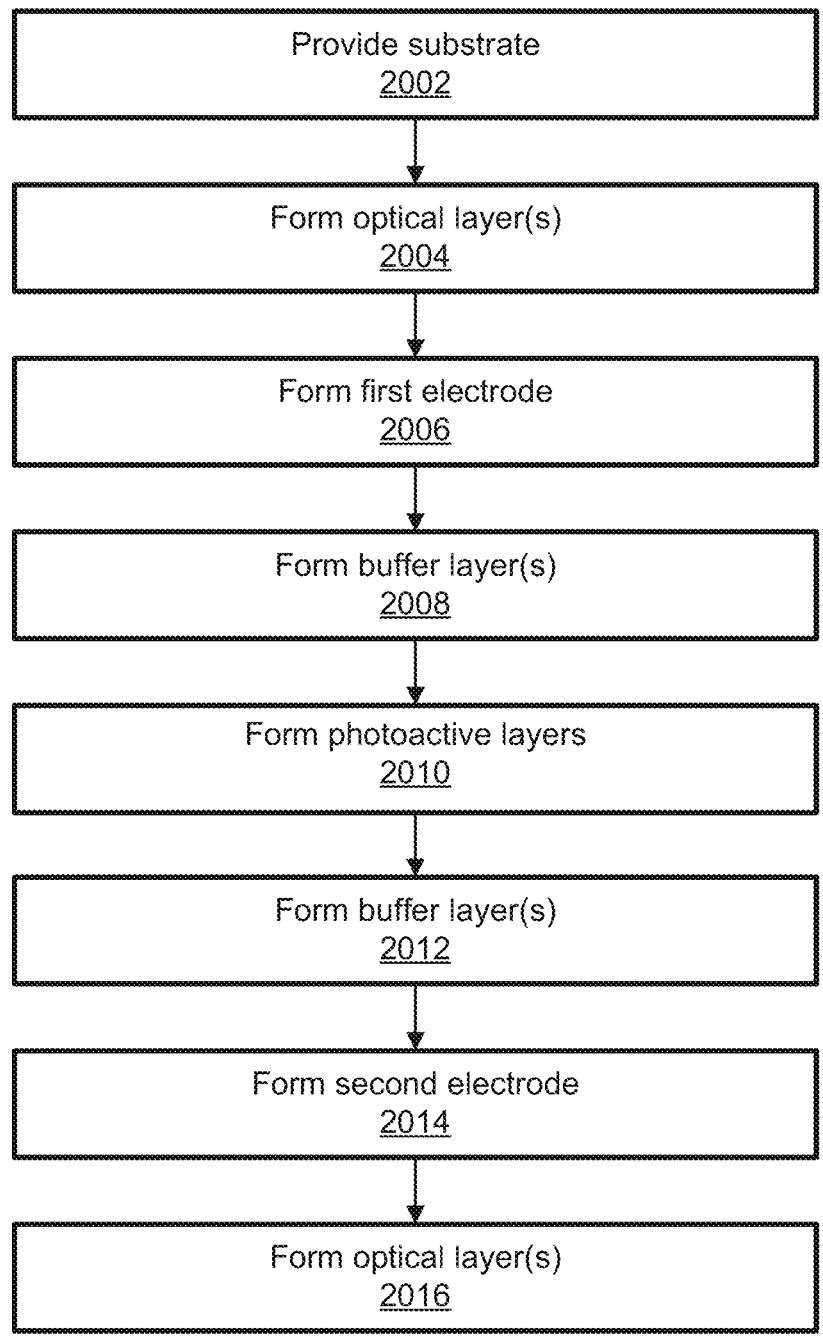
FIG. 20 illustrates a method for making a visibly transparent photovoltaic device.

FIG. 20 illustrates a method 2000 for making a photovoltaic device, such as visibly transparent photovoltaic device 100. In various embodiments, the photovoltaic device may be visibly transparent or may be non-visibly transparent or opaque. For example, any of the components of the photovoltaic device described in reference to method 2000 may be non-visibly transparent, such as an opaque first electrode (at block 2006) or an opaque second electrode (at block 2014). Furthermore, any of the components described in reference to method 2000 as being visibly transparent may, in some embodiments, be non-visibly transparent or opaque. Method 2000 may include additional or fewer steps than is illustrated in FIG. 20. Furthermore, one or more steps of method 2000 may be performed in a different order than is illustrated in FIG. 20.

Method 2000 begins at block 2002, where a substrate is provided, such as, e.g., a transparent substrate. It will be appreciated that useful transparent substrates include visibly transparent substrates, such as glass, plastic, quartz, and the like. Flexible and rigid substrates are useful with various embodiments. Optionally, the transparent substrate is provided with one or more optical layers preformed on top and/or bottom surfaces.

At block 2004, one or more optical layers are optionally formed on or over the transparent substrate, such as on top and/or bottom surfaces of the transparent substrate. Optionally, the one or more optical layers are formed on other materials, such as an intervening layer or material, such as a transparent conductor. Optionally, the one or more optical layers are positioned adjacent to and/or in contact with the visibly transparent substrate. It will be appreciated that formation of optical layers is optional, and some embodiments may not include optical layers adjacent to and/or in contact with the transparent substrate. Optical layers may be formed using a variety of methods including, but not limited to, one or more chemical deposition methods, such as plating, chemical solution deposition, spin coating, dip coating, slot-die coating, blade coating, spray coating, chemical vapor deposition, plasma enhanced chemical vapor deposition, and atomic layer deposition, or one or more physical deposition methods, such as thermal evaporation, electron beam evaporation, molecular beam epitaxy, sputtering, pulsed laser deposition, ion beam deposition, and electrospray deposition. It will be appreciated that useful optical layers include visibly transparent optical layers. Useful optical layers include those that provide one or more optical properties including, for example, antireflection properties, wavelength selective reflection or distributed Bragg reflection properties, index matching properties, encapsulation, or the like. Useful optical layers may optionally include optical layers that are transparent to ultraviolet and/or near-infrared light. Depending on the configuration, however, some optical layers may optionally provide passive infrared and/or ultraviolet absorption. Optionally, an optical layer may include a visibly transparent photoactive compound described herein.

At block 2006, a first (e.g., bottom) electrode is formed, such as, e.g., a first transparent electrode. As described above, the transparent electrode may correspond to an ITO thin film or other transparent conducting film, such as thin metal films (e.g., Ag, Cu, etc.), multilayer stacks comprising thin metal films (e.g., Ag, Cu, etc.) and dielectric materials, or conductive organic materials (e.g., conducting polymers, etc.). It will be appreciated that transparent electrodes include visibly transparent electrodes. Transparent electrodes may be formed using one or more deposition processes, including vacuum deposition techniques, such as atomic layer deposition, chemical vapor deposition, physical vapor deposition, thermal evaporation, sputter deposition, epitaxy, etc. Solution based deposition techniques, such as spin-coating, may also be used in some cases. In addition, transparent electrodes may be patterned by way of microfabrication techniques, such as lithography, lift off, etching, etc.

At block 2008, one or more buffer layers are optionally formed, such as on the transparent electrode. Buffer layers may be formed using a variety of methods including, but not limited to, one or more chemical deposition methods, such as a plating, chemical solution deposition, spin coating, dip coating, chemical vapor deposition, plasma enhanced chemical vapor deposition, and atomic layer deposition, or one or more physical deposition methods, such as thermal evaporation, electron beam evaporation, molecular beam epitaxy, sputtering, pulsed laser deposition, ion beam deposition, and electrospray deposition. It will be appreciated that useful buffer layers include visibly transparent buffer layers. Useful buffer layers include those that function as electron transport layers, electron blocking layers, hole transport layers, hole blocking layers, optical spacers, physical buffer layers, charge recombination layers, or charge generation layers. In some cases, the disclosed visibly transparent photoactive compounds may be useful as a buffer layer material. For example, a buffer layer may optionally include a visibly transparent photoactive compound described herein.

In some embodiments, a p-phenylene layer is formed at block 2008. The p-phenylene layer may be formed by vapor depositing p-phenylene on a transparent electrode or on a different buffer layer. For example, the p-phenylene layer may be formed on a $MoO_3$ layer in any of the embodiments described herein. In some embodiments, the material can be deposited from solution, electrochemically, or reactively grown on the surface. In some embodiments, other related materials can be used that achieve a similar efficiency enhancement. The related materials may have similar molecular properties of the disclosed p-phenylene (such as other oligo-phenylenes, or substituted p-phenylenes) and they may be used in combination with other anode layers or buffers instead of the ITO and/or $MoO_3$ layers described herein. In some embodiments, the p-phenylene layer is used in an tandem architecture, in which the p-phenylene is deposited on top of the interconnecting recombination layers, on the anode, or both, with the same general effects for each subcell. In some embodiments, the p-phenylene layer is used in an inverted architecture, in which the anode is deposited on top of the photoactive layer with the same general effects. Other types of solar cells that may benefit from the p-phenylene layer may include lead-halide and other perovskites, quantum dot, and dye sensitized cells.

At block 2010, one or more photoactive layers are formed, such as on a buffer layer or on a transparent electrode. As described above, the photoactive layers may comprise electron acceptor layers and electron donor layers or co-deposited layers of electron donors and acceptors. Photoactive layers may be formed using a variety of methods including, but not limited to, one or more chemical deposition methods, such as a plating, chemical solution deposition, spin coating, dip coating, chemical vapor deposition, plasma enhanced chemical vapor deposition, and atomic layer deposition, or one or more physical deposition methods, such as thermal evaporation, electron beam evaporation, molecular beam epitaxy, sputtering, pulsed laser deposition, ion beam deposition, and electrospray deposition.

At block 2012, one or more buffer layers are optionally formed, such as on the photoactive layer. The buffer layers formed at block 2012 may be formed similar to those formed at block 2008.

At block 2014, a second (e.g., top) electrode is formed, such as, e.g., a second transparent electrode. The second transparent electrode may be formed on a buffer layer or on a photoactive layer.

At block 2016, one or more additional optical layers are optionally formed, such as on the second transparent electrode.

Method 2000 may optionally be extended to correspond to a method for generating electrical energy. For example, a method for generating electrical energy may comprise providing a visibly transparent photovoltaic device, such as by making a visibly transparent photovoltaic device according to method 2000. Methods for generating electrical energy may further comprise exposing the visibly transparent photovoltaic device to visible, ultraviolet and/or near-infrared light to drive the formation and separation of electron-hole pairs, for example, for generation of electrical energy. The visibly transparent photovoltaic device may include the visibly transparent photoactive compounds described herein as photoactive materials, buffer materials, and/or optical layers.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those compositions and methods consisting essentially of and consisting of the recited components or elements. The invention illustratively described herein suitably may be practiced in the absence of any element or elements, limitation or limitations which is not specifically disclosed herein.

Abbreviations that may be utilized in the present specification include:
TPBi: 2,2',2"-(1,3,5-Benzinetriyl)-tris(1-phenyl-1-H-benzimidazole)
HAT-CN: Dipyrazino[2,3-f:2',3'-h]quinoxaline-2,3,6,7,10,11-hexacarbonitrile
ITO: Indium Tin Oxide
$MoO_3$: Molybdenum Trioxide
SubPc: Boron subphthalocyanine chloride
$Cl_6$SubPc: 2,3,9,10,16,17-Hexachloro boron subphthalocyanine chloride
PCE10: Poly[4,8-bis(5-(2-ethylhexyl)thiophen-2-yl)benzo[1,2-b; 4,5-b']dithiophene-2,6-diyl-alt-(4-(2-ethylhexyl)-3-fluorothieno[3,4-b]thiophene-)-2-carboxylate-2-6-diyl)]
COi8DFIC: 2,2'-[[4,4,11,11-tetrakis(4-hexylphenyl)-4,11-dihydrothieno[2',3':4,5]thieno[2,3-d]thieno[2"",3"":4"',5"']thieno[2"',3"':4",5"]pyrano[2",3":4',5']thieno[2',3':4,5]thieno[3,2-b]pyran-2,9-diyl]bis[methylidyne(5,6-difluoro)]]
$PC_{71}BM$: [6,6]-Phenyl-C71-butyric acid methyl ester The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered within the scope of this invention as defined by the appended claims.

What is claimed is:

1. An organic photovoltaic device comprising:
a substrate;
a first electrode coupled to the substrate;
a buffer layer coupled to the first electrode, wherein the buffer layer comprises a p-phenylene layer having a p-phenylene polymer, wherein the p-phenylene polymer has a formula of:

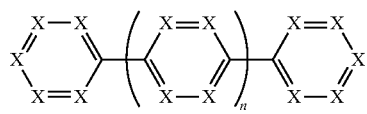

wherein each X is independently C—R or N, wherein n is 1, 2, 3, 4, or 5, and wherein each R is independently H, F, Cl, Br, $CH_3$, $OCH_3$, $Si(CH_3)_3$, $NH_2$, OH, SH, CN, or $CF_3$;
a second electrode disposed above the first electrode; and
one or more visibly transparent photoactive layers disposed between the buffer layer and the second electrode, the one or more visibly transparent photoactive layers having at least one electron donor material and at least one electron acceptor material.

2. The organic photovoltaic device of claim 1, wherein the p-phenylene polymer comprises a p-septiphenyl material, a p-sexiphenyl material, a p-quaterphenyl material, or a p-quinquiphenyl material.

3. The organic photovoltaic device of claim 1, wherein at least one X is N or at least one R is F, Cl, Br, $CH_3$, $OCH_3$, $Si(CH_3)_3$, $NH_2$, OH, SH, CN, or $CF_3$.

4. The organic photovoltaic device of claim 1, wherein the one or more visibly transparent photoactive layers include a single heterojunction.

5. The organic photovoltaic device of claim 4, wherein the single heterojunction is a planar heterojunction.

6. The organic photovoltaic device of claim 4, wherein the single heterojunction is a bulk heterojunction (BHJ).

7. The organic photovoltaic device of claim 1, wherein the one or more visibly transparent photoactive layers include a first bulk heterojunction (BHJ) active layer comprising a first blend of a first electron donor material and a first electron acceptor material and a second BHJ active layer comprising a second blend of a second electron donor material and a second electron acceptor material, wherein the second BHJ active layer is in contact with the first BHJ active layer.

8. The organic photovoltaic device of claim 1, further comprising:
a first subcell including one or more first visibly transparent photoactive layers;
a second subcell disposed between the first subcell and the second electrode, the second subcell including one or more second visibly transparent photoactive layers; and
a charge recombination zone disposed between the first subcell and the second subcell.

9. The organic photovoltaic device of claim 8, wherein the buffer layer is disposed between the first electrode and the first subcell.

10. The organic photovoltaic device of claim 8, wherein the buffer layer is disposed between the charge recombination zone and the second subcell.

11. The organic photovoltaic device of claim 8, wherein the buffer layer is disposed between the first electrode and the first subcell, and wherein the organic photovoltaic device further comprises:
a second buffer layer disposed between the charge recombination zone and the second subcell, wherein the second buffer layer comprises a second p-phenylene layer having a second p-phenylene polymer.

12. The organic photovoltaic device of claim 11, wherein the second p-phenylene polymer is different than the p-phenylene polymer.

13. The organic photovoltaic device of claim 11, wherein the second p-phenylene polymer is the same as the p-phenylene polymer.

14. The organic photovoltaic device of claim 1, wherein the one or more visibly transparent photoactive layers were deposited via thermally evaporation.

15. The organic photovoltaic device of claim 1, wherein the one or more visibly transparent photoactive layers were deposited via solution processing.

16. The organic photovoltaic device of claim 1, wherein the substrate, the first electrode, the buffer layer, the second electrode, and the one or more visibly transparent photoactive layers together exhibit an overall visible transmission of 30% or more.

17. The organic photovoltaic device of claim 1, wherein the organic photovoltaic device has a glass-reflected a* between −10 and 10 in International Commission on Illumination (CIE) L*a*b* (CIELAB) color space.

18. The organic photovoltaic device of claim 1, wherein the organic photovoltaic device has a glass-reflected b* between −10 and 10 in International Commission on Illumination (CIE) L*a*b* (CIELAB) color space.

19. The organic photovoltaic device of claim 1, wherein the buffer layer or the p-phenylene layer consists essentially of p-phenylene polymer.

20. The organic photovoltaic device of claim 1, further comprising:
   a hole injection layer disposed between the first electrode and the p-phenylene layer, wherein the hole injection layer is one of $MoO_x$, $NiO_x$, $CuO_x$, $VO_x$, $WO_x$, $CoO_x$, $CrO_x$, $Li:NiO_x$, $Mg:NiO_x$, $Cs:NiO_x$, $Cu:CrO_x$, $Cr_yCu_zO_x$, LiMgLiO, CuSCN, CuI, $BiI_3$, Graphene, Graphene Oxide, or $MoS_2$, corresponding to both stoichiometric and non-stoichiometric compositions.

\* \* \* \* \*